United States Patent [19]

Sasaki et al.

[11] Patent Number: 5,065,432

[45] Date of Patent: Nov. 12, 1991

[54] SOUND EFFECT SYSTEM

[75] Inventors: Akira Sasaki; Kazuyasu Sakai; Katsuyoshi Suzuki, all of Kanagawa, Japan

[73] Assignee: Kabushiki Kaisha Toshiba, Kanagawa, Japan

[21] Appl. No.: 429,289

[22] Filed: Oct. 31, 1989

[51] Int. Cl.[5] .................. H03G 3/00

[52] U.S. Cl. .................. 381/61; 381/1

[58] Field of Search .................. 381/1, 56, 97, 103, 381/110, 61, 62, 63

[56] References Cited

U.S. PATENT DOCUMENTS

| | | | |
|---|---|---|---|
| 4,612,665 | 9/1986 | Inami et al. | 381/56 |
| 4,688,258 | 8/1987 | Kunungi et al. | 381/103 |
| 4,694,497 | 9/1987 | Kasai et al. | 381/56 |
| 4,698,842 | 10/1987 | Mackie | 381/1 |
| 4,792,974 | 12/1988 | Chace | 381/1 |
| 4,870,690 | 9/1989 | Negishi et al. | 381/103 |
| 4,908,858 | 3/1990 | Ohno | 381/1 |

*Primary Examiner*—Forester W. Isen
*Attorney, Agent, or Firm*—Finnegan, Henderson, Farabow, Garrett, and Dunner

[57] ABSTRACT

An audio signal processing apparatus for processing an audio signal. The apparatus includes an audio signal input circuit into which the audio signals are input, an analyzer which analyzes the input audio signal and generates an output control signal, a sound effect processor which performs a prescribed sound effect processing on the input audio signal and outputs a resulting audio signal, a control circuit which controls the sound effect processor to optimize the sound effect processing in response to the control signal from the analyzer, and an audio signal output circuit for outputting the resulting audio signal.

26 Claims, 19 Drawing Sheets

SOUND EFFECT SYSTEM

FIELD OF THE INVENTION

The present invention relates generally to an audio signal processing apparatus, and more particularly to a sound effect system including an audio signal processing apparatus which produces a sound field corresponding to an original sound source by applying sound effect processing to an audio signal.

BACKGROUND OF THE INVENTION

Recently, many technical developments have been remarkably made in the field of audio equipment. For example, a stereophonic system has been widely used in audio equipment. Digital systems also have been widely used for processing audio signals. These systems make the reproduced sound more similar to the original sound.

Furthermore, a sound effect processing apparatus capable of producing a specific reproduced sound field suitable to a listener's preference, by processing an audio source signal, such as music signal, has been strongly demanded in recent years.

FIG. 1 shows a conventional audio signal processing apparatus for producing such a specific reproduced sound field. In FIG. 1, an audio signal input terminal 101 receives an audio signal. The audio signal is supplied from a CD (Compact Disc) player, a tape player, VTR (Video Tape Player), or a LD (Laser Disc) player, for example. The audio signal is applied to an analog to digital converter (referred to as A/D converter hereafter) 103 through a low pass filter (referred to as LPF hereafter) 102. The LPF 102 removes undesired high frequency components (referred to as HF or HF components) from the audio signal. The audio signal output from the LPF 102 is analog. The A/D converter 103 converts the analog audio signal to digital audio signal.

The digital signal is applied to a sound effect processor 104. The sound effect processor 104 produces a plurality of reverberation sound signals, e.g., two reverberation sound signals by processing the digital signal. The reverberation sound signals thus produced almost correspond to reverberation sounds in a concert hall, or other similar sound fields. The sound effect processor 104 is typically constructed of, for example, delay units, adders, multipliers and the like.

The reverberation sound signals are converted into analog reverberation sound signals by digital to analog converter (referred to as D/A converters hereafter) 105 and 106. The analog reverberation sound signals are applied to amplifiers 109 and 110 through LPFS 107 and 108. The LPFS 107 and 108 remove undesired HF components from the analog reverberation sound signals. The amplifiers 109 and 110 amplify the reverberation sound signals and then supply the signals to loudspeakers 111 and 112.

FIG. 1 shows only one channel of the audio signal processing apparatus for simplicity. However, the audio signal processing apparatus generally includes two channels for processing stereophonic signals. Then, actually four sets of the loudspeakers are arranged at the front left and right and rear left and right. Thus, the loudspeakers may produce specific sound effects for listeners according to the reverberation sound signals.

In short, in this surround system, the sound effect processor 104 performs various signal processing operations for two channel input audio signals and by outputting four channel sound, forms a sound field surrounding listeners. As a result, listeners are able to listen as if they were actually in a concert hall or a sports arena.

When creating an atmosphere equivalent to, for instance, a concert hall, the sound effect processor 104 produces reverberation sound for 1 second (sec) to 2 secs. However, this reverberation sound is produced not only for music but also when, for instance, an announcer or a master of ceremony (referred to as M.C. hereafter) is speaking. There is a problem because this reverberation sound is unnatural, and it is hard to hear what the M.C. is saying.

Further, when processing sound from a sports arena, the sound effect processor 104 produces, for instance, an echo of about several hundreds of milli-seconds (ms). This echo is produced not only for shouts of encouragement by the audience, but also is added to the voices of announcers or commentators, and the same problems mentioned above are caused.

SUMMARY OF THE INVENTION

It is, therefore, an object of the present invention to provide an audio signal processing apparatus which is capable of creating optimum sound effects according to the type of sound source.

In order to achieve the above object, an audio signal processing apparatus according to one aspect of the present invention is provided with an audio signal input circuit into which the audio signals are input, an audio signal analysis circuit which analyzes the input audio signals and generates an output control signal, a sound effect processor which performs prescribed sound effect processing on the input audio signals and outputs a resulting audio signal, a control circuit which controls the sound effect processor to optimize the sound effect processing in response to the control signal from the audio signal analysis circuit and an audio signal output circuit for outputting the resulting audio signal.

Additional objects and advantages of the present invention will be apparent to persons skilled in the art from a study of the following description and the accompanying drawings, which are hereby incorporated in and constitute a part of this specification.

BRIEF EXPLANATION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
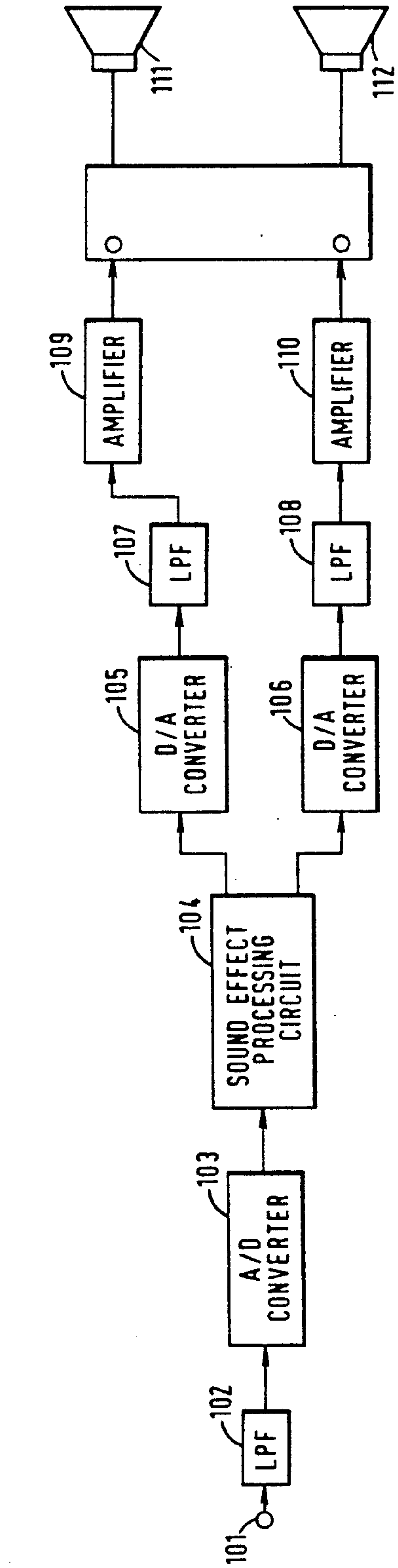
FIG. 1 (PRIOR ART)
FIG. 1 is a block diagram showing the construction of a conventional audio signal processing apparatus.

The present invention will be described in detail with reference to the FIGS. 2 through 39. Throughout the drawings, reference numerals or letters used in FIG. 1 will be used to designate like or equivalent elements for simplicity of explanation.

Figure 2:
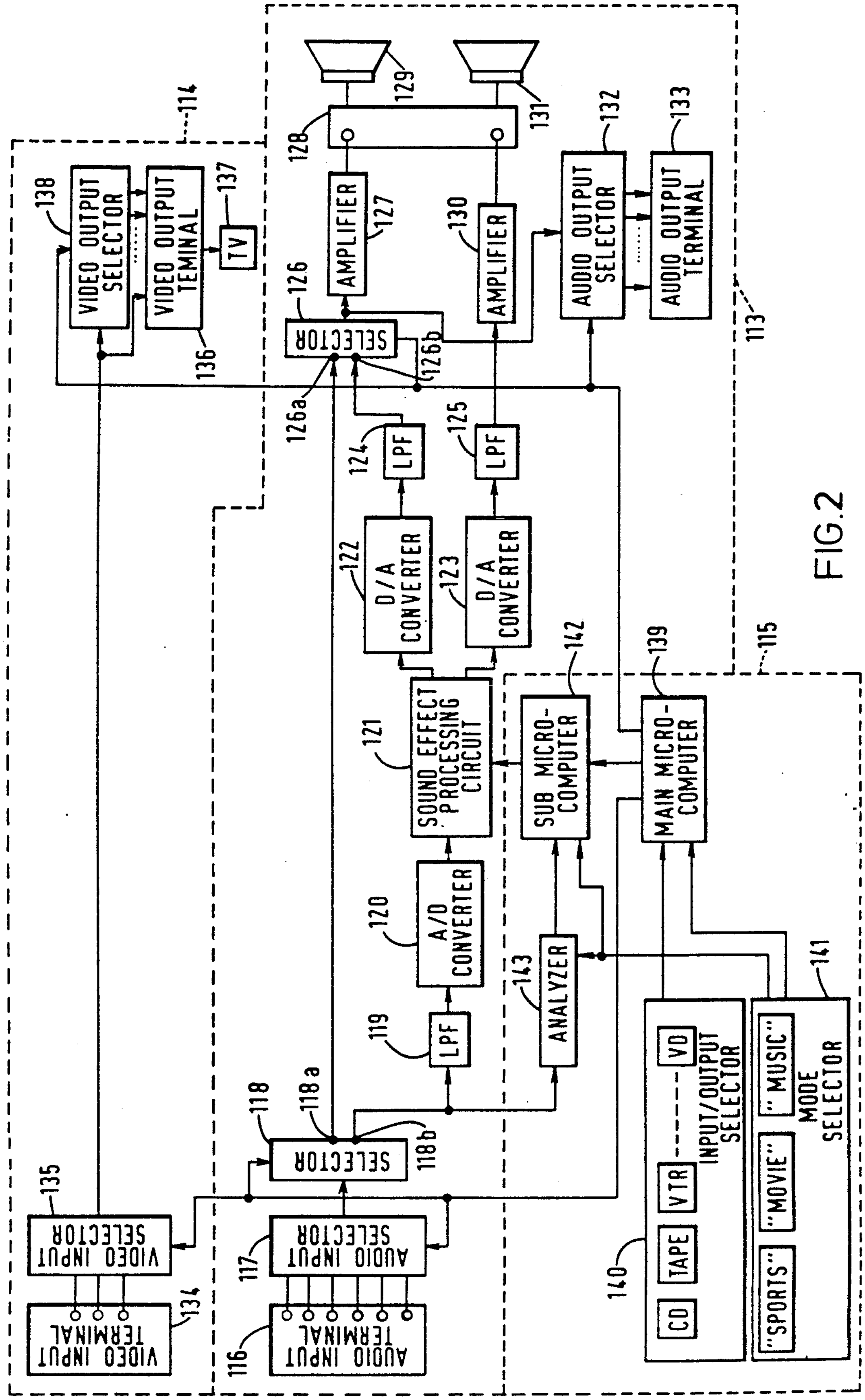
FIG. 2 is a block diagram showing a first embodiment of the audio signal processing apparatus according to the present invention.

FIG. 2 is a block diagram showing the construction of an audio signal processing apparatus of the first embodiment of the present invention. The audio signal processing apparatus of the first embodiment is comprised of the audio system 113, video system 114 and control system 115. Further, in the drawing, only one channel of the audio system is presented as the audio system 113, but there may be two channel audio systems which operate together to form a stereophonic sound system.

AUDIO SYSTEM 113

In the audio system 113, an audio signal input terminal block 116 is provided for receiving a plurality of audio signals from or CD players, tape players, video players, LD (Laser Disc) players, for example. One of these audio signals input into the audio signal input terminal block 116 is selected by the audio input selector 117. The audio signal passed through the audio input selector 117 is then applied to a selector 118.

The selector 118 selects whether or not the audio signal is processed by a prescribed sound effect process, in cooperation with another selector 126. That is, the audio signal not to be processed is output from a first output terminal 118*a* of the selector 118. The audio signal not to be processed is directly input to the selector 126, i.e., a first input terminal 126*a* of the selector 126. On the other hand, the audio signal which is to be processed is output from a second output terminal 118*b* of the selector 118. The audio signal thus selected is input to a second input terminal 126*b* of the selector 126 through a sound effect processor as described in detail below.

The audio signal to be processed is applied to an A/D converter 120 through an LPF 119. The LPF 119 removes the high frequency components of the audio signal. The A/D converter 120 converts the audio signal to a digital signal. The digital audio signal is input into a sound effect processor 121. The sound effect processor 121 produces a reverberation sound signal which resembles the reverberation sound in concert halls, stadiums, etc. The digital audio signal and the reverberation sound signal are converted into analog signals by D/A converters 122 and 123, respectively. These analog signals are applied to LPFS 124 and 125. The LPFS 124 and 125 remove undesired high frequency components.

The analog audio signals output from the LPF 124 are applied to an amplifier 127 through the selector 126. The amplifier 127 amplifies the audio signals to drive loudspeakers 129 at the front side, which are connected through an output terminal block 128.

The analog audio signals output from the LPF 125 are applied to an amplifier 130. The amplifier 130 amplifies the audio signals to drive and output sound.

The audio signals not to be processed are applied to the amplifier 127 only through the selectors 118 and 126.

Further, the audio signal output from the selector 126 is applied to an additional audio output terminal block 133 through an audio output selecter 132.

VIDEO SYSTEM 114

In the video system 114, a video signal input terminal block 134 is provided for receiving a plurality of video signals from CD players, video players, or LD (Laser Disc) players, for example. One of these video signals input into the video signal input terminal block 134 is selected by the video input selector 135. The video signal passed through the video input selector 134 is supplied to a video display, e.g., a television receiver 137, through a video output terminal block 136 or both a video output selector 138 and a video output terminal block 136.

CONTROL SYSTEM 115

The control system 115 is provided with a main microcomputer 139, a sub microcomputer 142 and an analyzer 143 for controlling the audio system 113 and the video system 114.

The main microcomputer 139 controls the audio input selector 117, the selectors 118 and 126, the audio output selector 132, the video input selector 135, and the video output selector 138 according to operation commands given by a user through an input/output selector 140. The input/output selector 140 is provided with a plurality of input source keys, e.g., "CD", "TAPE", "VTR", "LD", etc. These keys are operated by the user.

Further, the main microcomputer 139 controls the sound effect processor 121 through the sub microcomputer 142. The control of the sound effect processor 121 is made in response to the audio signal analysis means, i.e., an analyzer 143, and a mode selector 141 which is connected to the main microcomputer 139, as described in detail later. The mode selector 141 is provided with a plurality of mode keys, e.g., "SPORTS", "MOVIE", "MUSIC", etc. These keys are also operated by the user.

Then, the sub microcomputer 142 controls the sound effect processor 121 to optimize the operation thereof according to the signal.

ANALYZER 143

Figure 3:
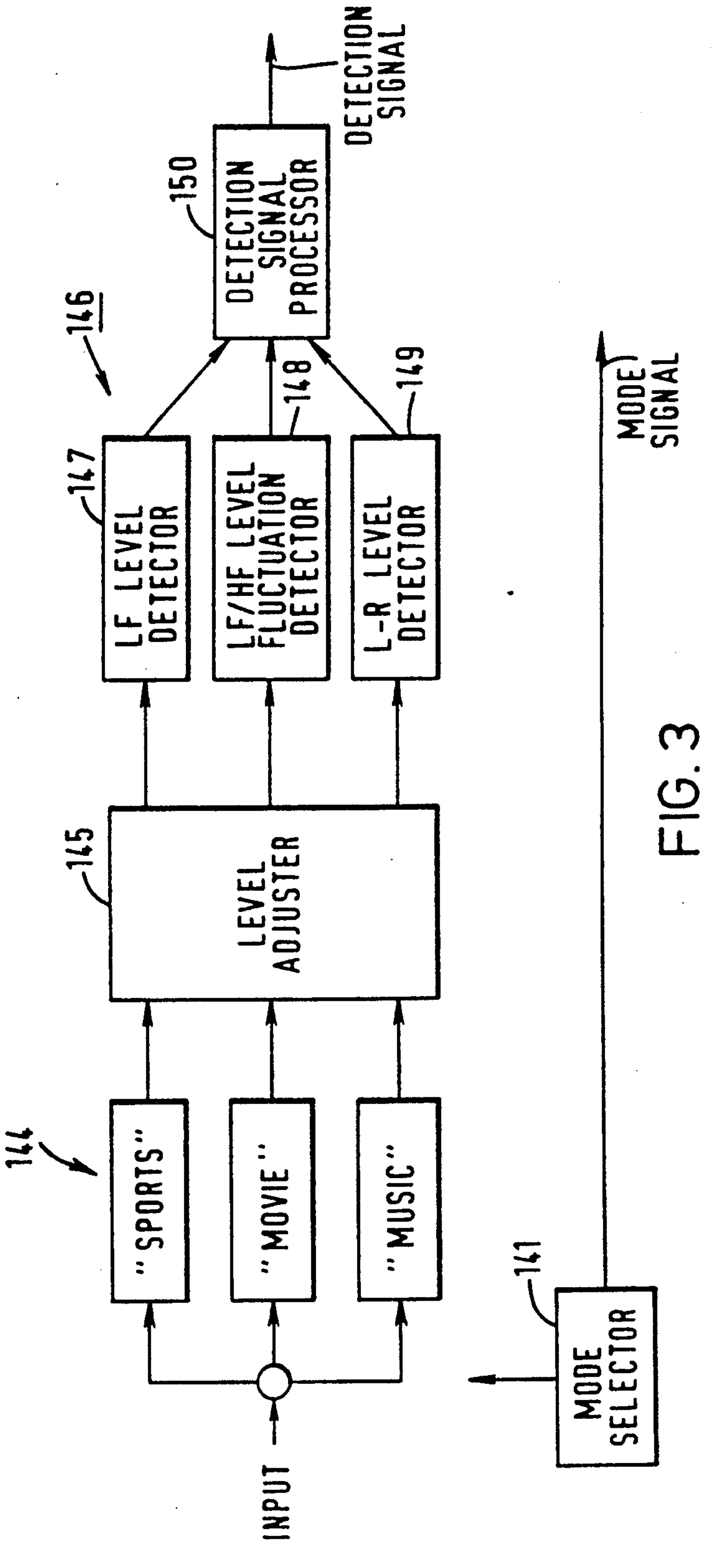
FIG. 3 is a block diagram showing details of the audio signal analysis means of FIG. 2.

FIG. 3 shows the analyzer 143.

In FIG. 3, the audio signal on the second output terminal 118*b* of the selector 118 (see FIG. 2) is further applied to the analyzer 143. The audio signal is then input to the mode selection circuit 144. The mode selection circuit 144 sets up a mode corresponding to the categories "SPORTS", "MOVIE" or "MUSIC". The mode setting operation in the mode selection circuit 144 is executed by a signal from the mode selection key block 141. The audio signal passing through the mode selection circuit 144 is set at a fixed level by a level adjuster 145.

The audio signal set at the fixed level is applied to a level detector 146. The level detector 146 detects the level of a particular signal component of the audio signal for each mode, i.e., "SPORTS", "MOVIE" and "MUSIC". The particular component level detector block 146 is provided with a low frequency component (referred as to LF or LF component hereafter) level detector 147, a low and high frequency components (referred as to LF/HF or LF/HF components hereafter) level fluctuation detector 148, and a left-right signal (referred as to L-R or L-R signal hereafter) level detector 149.

If the "SPORTS" mode is selected, the audio signal is input into the LF level detecter 147. The LF level detector 147 detects the level of the LF component of the audio signal. If the "MOVIE" mode is selected, the audio signal is input into the LF/HF level fluctuation detector 148. The LF/HF level fluctuation detector 148 detects level fluctuations of the LF/HF components of the audio signal. If the "MUSIC" mode is selected, the audio signal is input into the L-R level detector 149. The L-R level detector 149 detects a level of the difference between two signals of the audio signals which are stereophonically related with each other.

The signal detected by the level detector 146 is output from the analyzer 143 through a detection signal processor 150. The detection signal processor 150 delays the following edge portion of the detected signal by a prescribed time constant.

The detected signal output from the analyzer 143 is applied to the sub microcomputer 142.

LEVEL ADJUSTER 145

Figure 4:
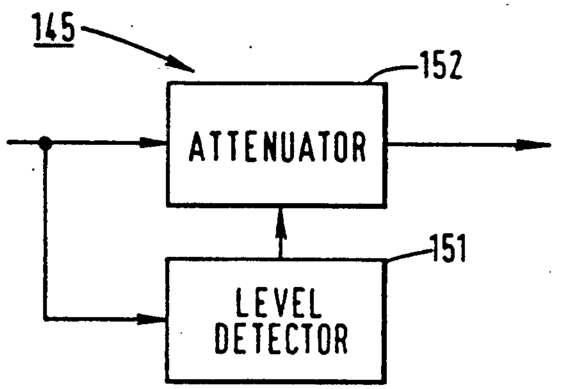
FIG. 4 is a block diagram showing details of the level adjuster of FIG. 3.

FIG. 4 shows the level adjuster 145. The level adjuster 145 comprises a level detector 151 and an attenuator 152.

As shown in FIG. 4, the audio signal is applied to both the level detector 151 and the attenuator 152 from the mode selector 144. The level detector 151 detects the level of the audio signal and then controls the attenuation of the attenuator 152 in response to the level. Thus, the level of the audio signal output from the attenuator 152 is maintained at a desired level. Therefore, even when the level of the audio signal differs between the modes or audio signal sources, the sound source situation of the audio signal is always analyzed at the optimum state in the level detector 146.

Figure 5:
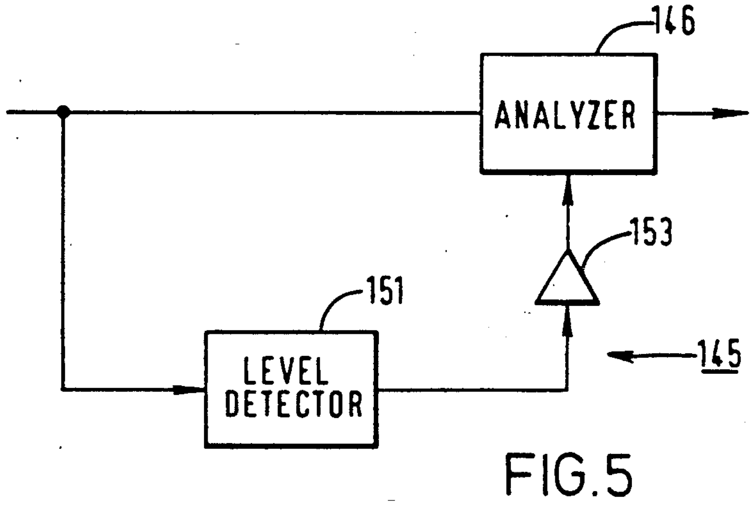
FIG. 5 is a block diagram showing another example of the level adjuster.

FIG. 5 shows another example of the level adjuster 145. The level adjuster 145 comprises a level detector 151 and an amplifier 153.

As shown in FIG. 5, the audio signal is applied to the level detector 151 from the mode selector 144. The level detector 151 detects the level of the audio signal. The detected level is applied to the level detector 146 after being amplified by the amplifier 153. Thus, the level of the audio signal output from the attenuator 152 is kept constant. Therefore, even when the level of the audio signal differs among the modes or audio sources, the optimum level of the audio signal is always applied to the level detector 146 for analysis of the audio source situation.

Thus, the level adjusters 145 as shown in FIGS. 4 and 5 adjust the level of the audio signal to a standard level signal which is suitable for the analysis of the audio signal in the level detector 146.

LEVEL DETECTOR 146

(1) LF Level Detector 147

Figure 6:
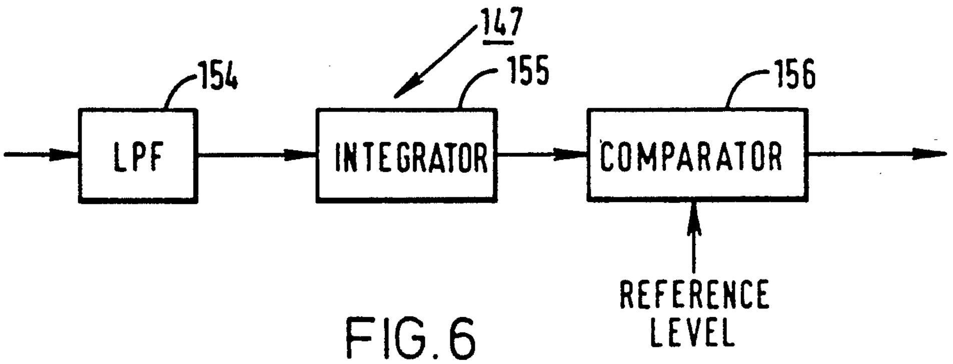
FIG. 6 is a block diagram showing details of the LF level detector of FIG. 3.

FIG. 6 shows the LF level detector 147. The LF level detector 147 comprises an LPF 154, an integrator 155 and a comparator 156.

As shown in FIG. 6, the audio signal output from the level adjuster 145 is applied to the LPF 154. The LPF 154 removes the desired HF components of the audio signal. The audio signal is then applied to the integrator 155 and is integrated. The integrated audio signal is applied to the comparator 156. The comparator 156 compares the audio signal with a reference level. The comparator 156 generates a detection signal when the level of the audio signal is higher than the reference level.

Figure 7:
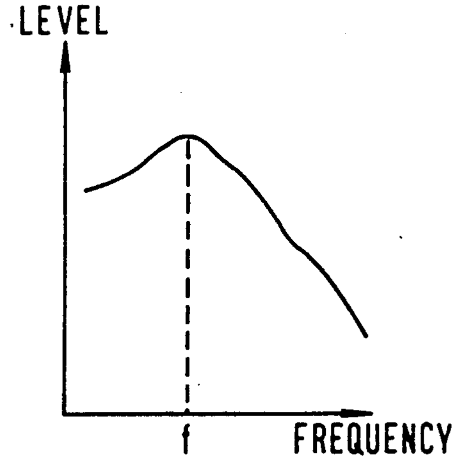
FIGS. 7 and 8 are frequency response charts of audio signals for explaining the operation of the LF level detector.

This LF level detector 147 is used in the "SPORTS" mode. In case of sports programs, the sound source situations are broadly divided into cheers or hand clapping and the voices of announcers or commentators. These situations differ in their frequency characteristic (spectrum). In the former situation, the LF component is relatively low as shown in FIG. 7. On the other hand, in the latter situation, the LF component is relatively high, as shown in FIG. 8.

Figure 8:
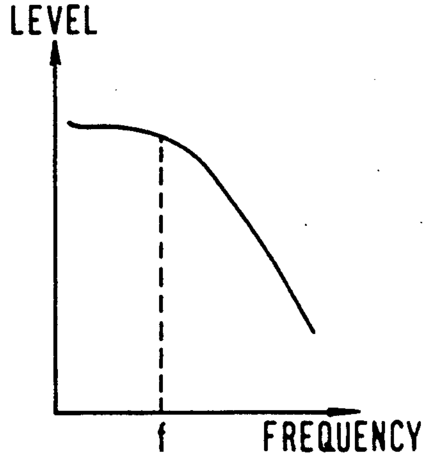

The LF level detector 147 discriminates these sound sources from each other according to this frequency response characteristics, as shown in FIGS. 7 and 8. That is, the LF level detector 147 judges whether the audio signal has the sounds of cheers or hand clapping or the sounds of the voices of announcers or commentators from the level of the LF component of the audio signal. When the level of the LF component is higher than the reference level, it is assumed that the voices of announcers or commentators is input to the audio signal processing apparatus. Then, the detection signal is output from the LF level detector 147.

Figure 9:
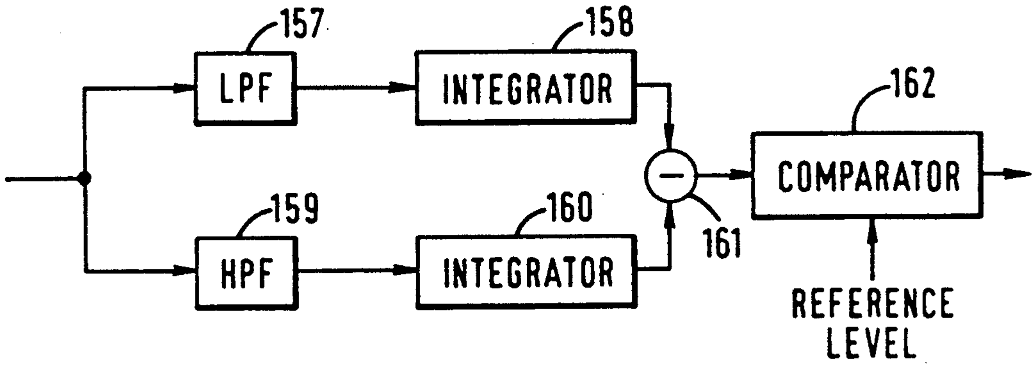
FIG. 9 is a block diagram showing another example of the LF level detecter.

FIG. 9 shows another example of the LF level detector 147. This example of the LF level detector 147 further comprises a high pass filter (referred as to HPF hereafter) 159, another integrator 160 and a substractor 161.

As shown in FIG. 9, the LF component of the audio signal output from the level adjuster 145 is removed by the LPF 157 and the integrator 158. Further, the HF component of the audio signal is removed by the HPF 159 and the integrator 160. These LF/HF components of the audio signal are subtracted in the subtractor 161. The difference signal is compared with the reference level. When the level of the difference signal is higher than the reference level, a detection signal is output from the comparator 162.

The LF level detector 147 of FIGS. 6 and 9 can be digitized. In this case, the audio signal is converted to digital signal before the application to the circuit.

(2) LF/HF Level Fluctuation Detector 148

Figure 10:
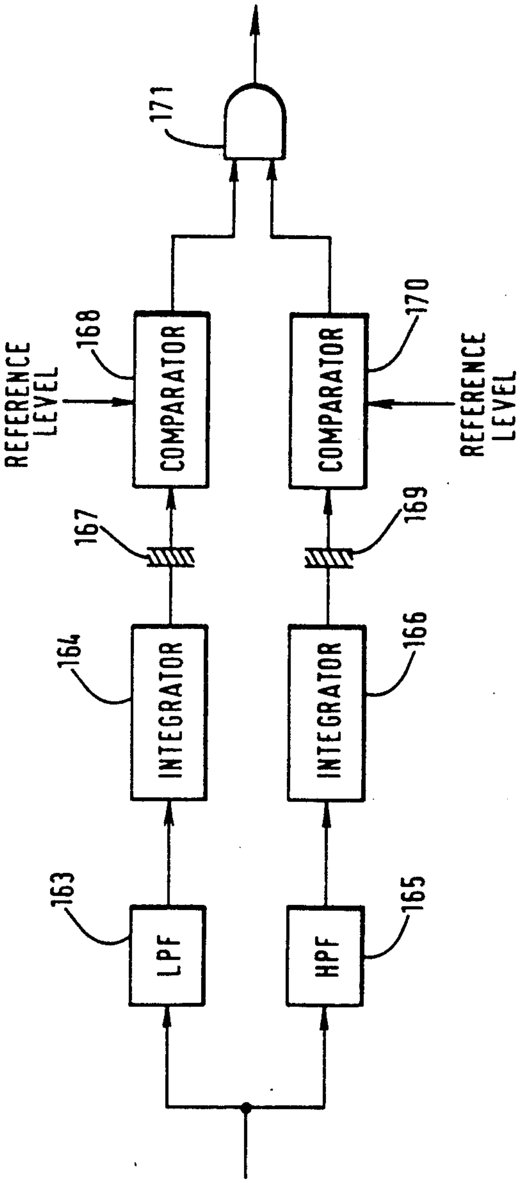
FIG. 10 is a diagram showing details of the LF/HF level fluctuation detector of FIG. 3.

FIG. 10 shows the LF/HF level fluctuation detector 148. The LF/HF level fluctuation detector 148 comprises an LPF 163, an HPF 165, a pair of integrators 164 and 166, a pair of capacitors 167 and 169, a pair of comparators 168 and 170 and an AND gate 171.

As shown in FIG. 10, the LF component of the audio signal output from the level adjuster 145 is removed by the LPF 163 and the integrator 164. The HF component of the audio signal is removed by the HPF 165 and the integrator 166. DC components of the LF/HF components are removed by the capacitors 167 and 169. Thus, the AC components of the LF/HF components, i.e., the level fluctuations thereof, are compared with a reference level in the comparators 168 and 170, respectively. When the level fluctuations of the low and high frequency components are higher than the reference levels, the comparators 168 and 170 output detection signals. These detection signals are applied to the AND gate 171. Thus, a detection signal of the LF/HF level fluctuation detector 148 is generated when both the detection signals of the comparators are simultaneously output, i.e., when both the level fluctuations of the LF/HF components of the audio signal are higher than the reference level.

Figure 11:
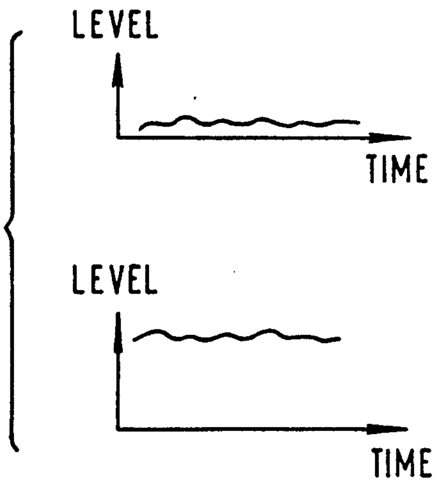
FIGS. 11 to 14 are level diagrams of audio signals with respect to time for explaining the operations of the LF/HF level fluctuation detectors.
Figure 12:
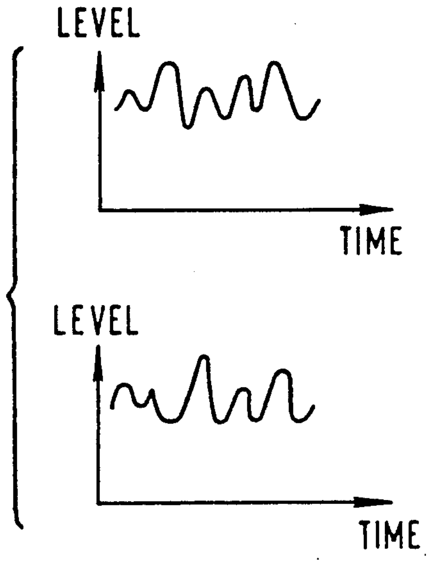
Figure 13:
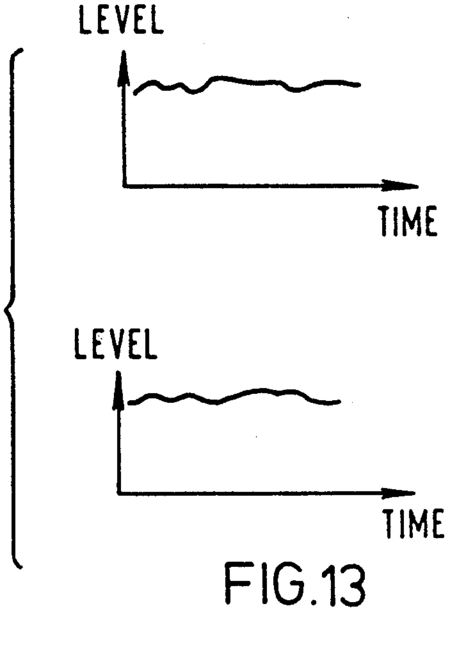
Figure 14:
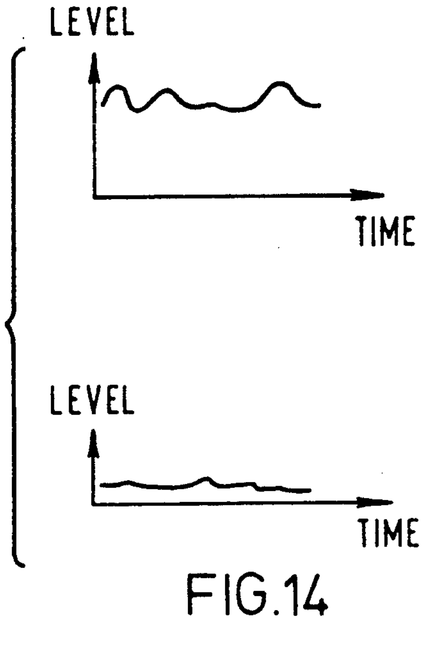

The LF/HF level fluctuation detector 148 is used in the "MOVIE" mode. In case of movie programs, drama programs, etc., the sound source situations are broadly divided into narrations and other types of sounds. These situations differ from each other in the level fluctuation of the audio signal. That is, in the case of narrations, the level fluctuations of the LF/HF components are relatively high, as shown in FIG. 12. In the other case, e.g., cheers, the level of the HF component is high and its level fluctuation is small, as shown in FIG. 11. In the case of the sound of waves, the levels of the LF/HF components are high but their fluctuations are small, as shown in FIG. 13. In the case of the sound of cars, the level of the LF component only is high and its fluctuation is slightly large. The LF/HF level fluctuation detector 148 discriminates these sound source situations from each other according to their level fluctuation characteristics, as shown in FIGS. 11 to 14. That is, the LF/HF level fluctuation detector 148 determines whether the audio signal is a narration or other type of sound based upon the level fluctuations of the LF/HF components of the audio signal. When both the level fluctuations of the LF/HF components are higher than the reference level, it is assumed that a narration is input to the audio signal processing apparatus. Then, the detection signal is output from the LF/HF level fluctuation detector 148.

(3) L-R Level Detector 149

Figure 15:
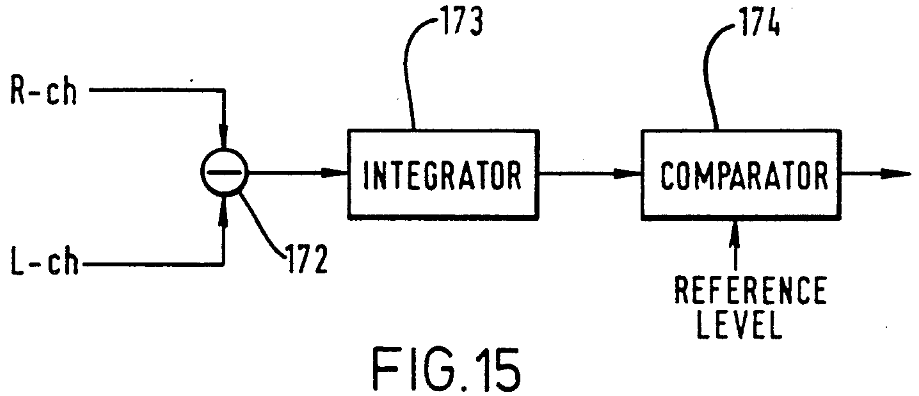
FIG. 15 is a block diagram showing details of the L-R level detecter of FIG. 3.

FIG. 15 shows the L-R level detector 149. The L-R level detector 149 comprises a subtractor 172, an integrator 173 and a comparator 174.

As shown in FIG. 15, sterophonic signals (L-ch and R-ch) are subtracted from each other in the subtractor 172. Thus, the L-R signal between the stereophonic signals (L-ch and R-ch) is output from the subtractor 172. The L-R signal is integrated in the integrator 173. The integrated L-R signal is compared with a prescribed reference in the comparator 174. The comparator 174 outputs a detection signal when the level of this L-R signal is lower than the reference level.

Figure 16:
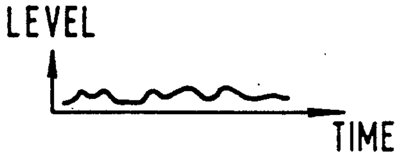
FIGS. 16 and 17 are level diagrams of audio signals with respect to time for explaining the operation of the L-R level detecter.
Figure 17:
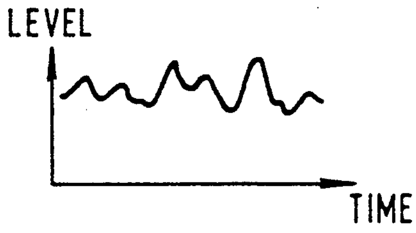

The L-R level detector 149 is used in the "MUSIC" mode. In case of music programs, the audio signal may be broadly classified into two types of signals, i.e., those relating to the music performance and the voice of an M.C. These signals differ from each other because of the stereophonic aspects of the music performance and the voice of the M.C. The voice of the M.C. is close to the monaural state. That is, in the voice of M.C., the L-R signal is relatively low, as shown in FIG. 16. On the other hand, in the music performance, the L-R signal is relatively high, as shown in FIG. 17.

The L-R level detector 149 discriminates these sound source situations from each other according to the difference in stereophonic aspects between the music performance and the voice of an M.C. That is, the L-R level detector 149 determines whether the audio signal is a music performance or the voice of an M.C. in response to the level of the L-R signal. When the L-R signal is lower than the reference level, it is assumed that the voice of an M.C. is input to the audio signal processing apparatus. Then, the detection signal is output from the L-R level detector 149.

The level detector 146 should not be limited only to those structures referred to above.

Figure 18:
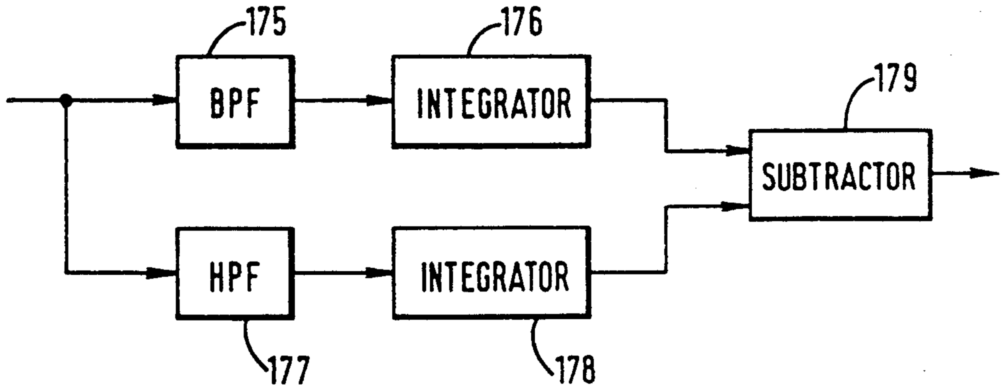
FIG. 18 is a block diagram showing another example of the LF/HF level fluctuation detector.

FIG. 18 shows another example of the LF/HF level fluctuation detector 148. The LF/HF level fluctuation detector 148 comprises a band pass filter (referred as to BPF hereafter) 175, an HPF 177, a pair of integrators 176 and 178 and a subtractor 179.

As shown in FIG. 18, the audio signal output from the level adjuster 145 is applied to both the BPF 175 and the HPF 177. The BPF 175 extracts the intermediate frequency component (referred as to IF or IF component hereafter) of the audio signal. The IF component of the audio signal is integrated in the integrator 176. The HPF 177 extracts the HF component of the audio signal. The HF component of the audio signal is integrated in the integrator 178. The integrated IF and HF signals are subtracted from each other in the subtractor 179. Thus, the difference of the component signals is output as the detection signal.

Figure 19:
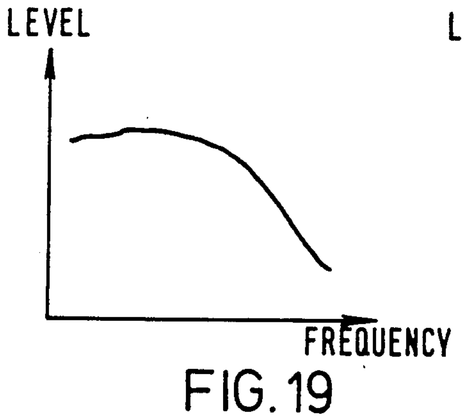
FIGS. 19 and 20 are frequency response charts of audio signals for explaining the operations of the LF/HF level fluctuation detectors of FIG. 18.
Figure 20:
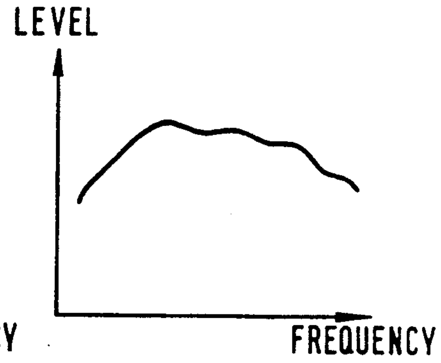

This LF/HF level fluctuation detector 148, as shown in FIG. 19, is used in, for instance, the "MOVIE" mode. In case of movie programs, drama programs, etc., it may be desirable to divide the audio signal into words spoken indoors and words spoken outdoors. These signals differ in frequency characteristic (spectrum). That is, the voices indoors have only IF components, as shown in FIG. 19. On the other hand, the voices outdoors have HF noise in addition to the IF component in many cases, as shown in FIG. 20. This circuit determines whether situations are indoor words situations or outdoor word situations according to the presence of the HF component in the audio signals in addition to the IF component.

Figure 21:
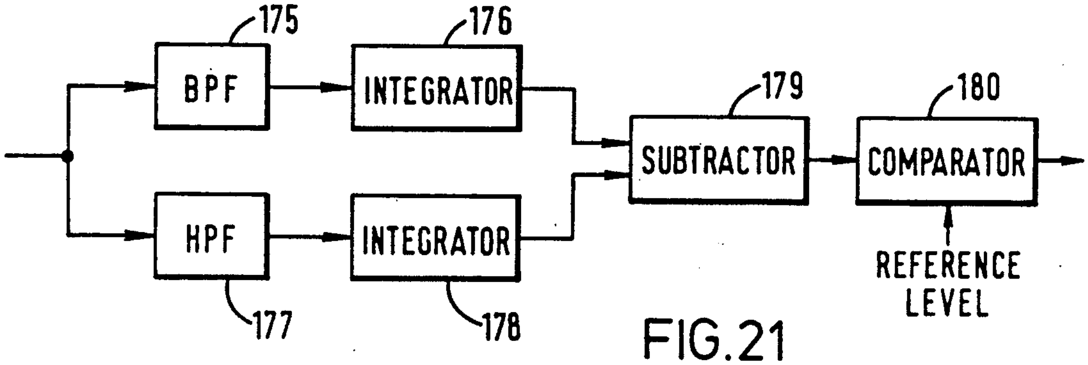
FIGS. 21 and 22 are block diagrams showing modifications of the LF/HF level fluctuation detectors shown in FIG. 18.

FIG. 21 shows a modification of the LF/HF level fluctuation detector 148 shown in FIG. 18.

The LF/HF level fluctuation detector 148, as shown in FIG. 21, compares the differential signal output from the subtractor 179 shown in FIG. 18 with a standard signal level preset by the comparator 180, and outputs the detection signal as a binary number.

Figure 22:
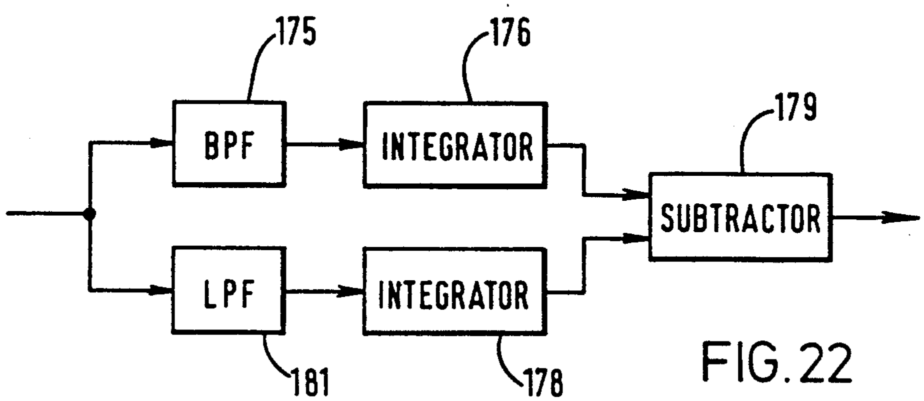

FIG. 22 shows another modification of the LF/HF level fluctuation detector 148 shown in FIG. 18. The LF/HF level fluctuation detector 148, as shown in FIG. 22, is identical to that shown in FIG. 18 with the exception of the HPF 177 which has been replaced with the LPF 181. This circuit is suitable for audio signals in an environment where LF noises such as cars, etc, are involved.

Further, in the examples only one situation detector is used for each mode. Needless to say, it is possible to combine multiple situation detectors with multiple modes. In this case, more accurate situation estimation can be achieved.

DETECTION SIGNAL PROCESSOR 150

Figure 23:
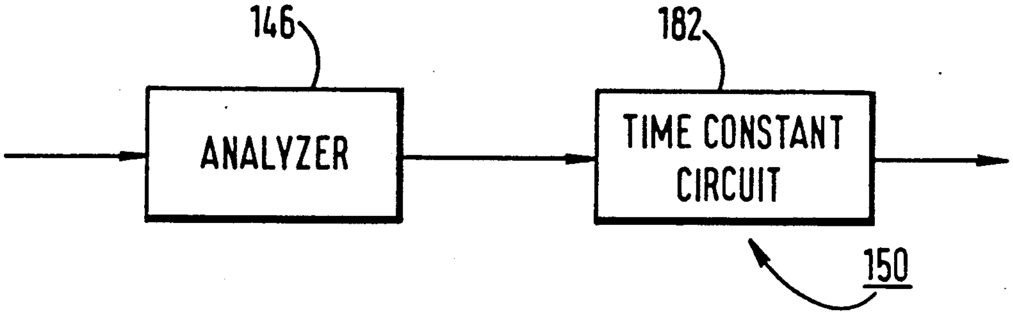
FIG. 23 is a block diagram showing details of the detection signal processor of FIG. 3.

FIG. 23 is a diagram showing the construction of the detection signal processor 150.

Figure 24:
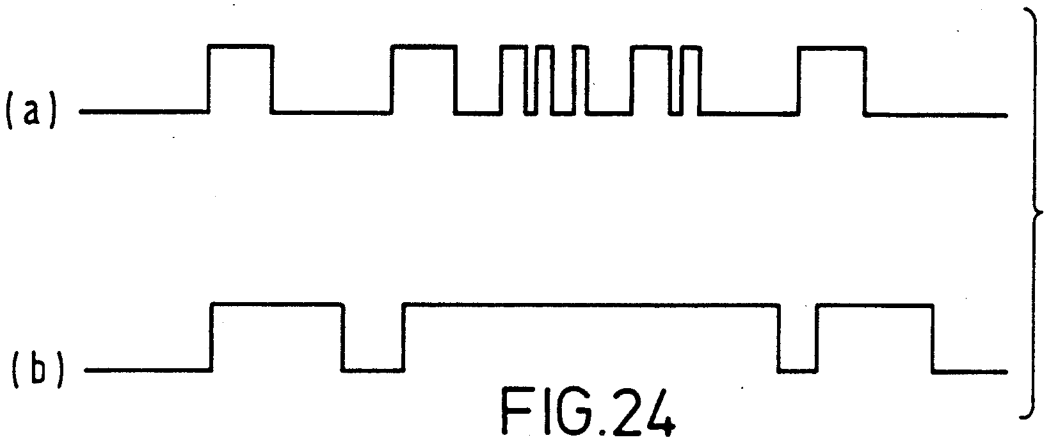
FIG. 24 is a waveform diagram for explaining the operation of the detection signal processor.

As shown in FIG. 23, the detection signal from the particular component level detector block 146 is delayed in its fall by the time constant circuit 182 which consists of resistors, capacitors, etc. As shown in FIG. 24, the frequency of changes of the detection signal (FIG. 24A) output from the level detector 146 is reduced, as shown in FIG. 24B, by the time constant circuit 182, if the situation frequently changes. Thus, frequent changes of the detection signal from word to word are prevented and, as a result, any unnaturalness caused during listening is eliminated.

Figure 25:
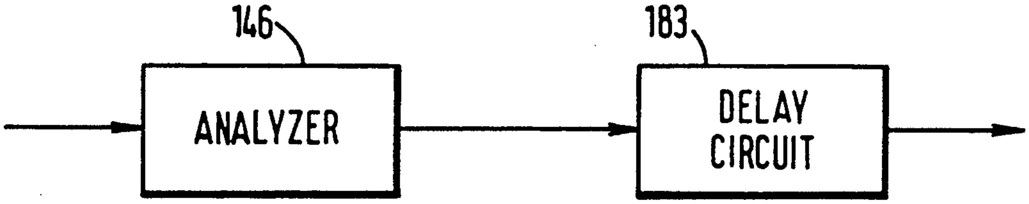
FIG. 25 is a block diagram showing another example of the detection signal processor.

The detection signal processor 150 can be digitized by replacing the time constant circuit 182 with a delay circuit 183, as shown in FIG. 25.

SOUND EFFECT PROCESSOR 121

The sound effect, processor 121 is generally composed of a sound field signal processor. The sound field signal processor comprises a gain adjuster, a delay time adjuster, a frequency characteristic adjuster and a phase adjuster. The sound effect processor can additionally include an IIR (Infinite Impluse Response) filter. The sound effect processor adjusts gain, delay time, frequency characteristic, and phase of the audio signal output from the A/D converter 120 under the control of the sub microcomputer 142 (see FIG. 2).

Functions performed by the sound effect processor 121 are as follows:

The detection signal is input from the LF level detector 147, the LF/HF level fluctuation detector 148, or the L-R level detector 149 to the sub microcomputer 142 corresponding to a mode.

If the "SPORTS" mode is selected, the detection signal from the LF level detector 147 is input. Then, if it is determined that the audio signal source is voices of announcers or commentators, the adjustments shown below are carried out in the sound effect processor 121:

(1) The gain in the gain adjuster is reduced;

(2) The delay time is shortened by the delay time adjuster:

(3) The LF component is emphasized by the frequency characteristic adjuster; and (4) The phase difference is reduced by the phase adjuster.

On the other hand, if it was determined from this detection signal that the sound source is cheers or hand clapping, the adjustments shown below are carried out in the sound effect processor 121:

(1) The gain in the gain adjuster is extended;

(2) The delay time is increased by the delay time adjuster;

(3) The emphasis of the LF component is reduced in the frequency characteristic adjuster; and (4) The phase difference is increased by the phase adjuster large.

If the "MOVIE" mode is selected, the detection signal from the LF/HF level fluctuation detector 148 is input to the sound effect processor 121. Then, if it is determined from this detection signal that the sound source is voices, the adjustments shown below are carried out in the sound effect processor 121:

(1) The gain is reduced by the gain adjuster;

(2) The delay time is shortened by the delay time adjuster;

(3) The LF component is emphasized by the frequency characteristic adjuster; and (4) The phase difference of the audio signal is reduced by the phase adjuster.

On the other hand, if it is determined from this detection signal that the audio signal is other than words, the adjustments shown below are carried out in the sound effect processor 121:

(1) The gain in the gain adjuster is extended;

(2) The delay time is increased by the delay time adjuster;

(3) The emphasis of the LF component is reduced in the frequency characteristic adjuster; and (4) The phase difference is increased by the phase adjuster large.

If the "MUSIC" mode is selected, the detection signal from the L-R level detector 149 is input into the sound effect processor 121. Then, if it is determined from this detection signal that the sound source is the voice of the M.C., adjustments shown below are carried out in the sound effect processor 121:

(1) The gain is reduced by the gain adjuster;

(2) The delay time is shortened by the delay time adjuster;

(3) The LF component is emphasized by the frequency characteristic adjuster; and (4) The phase difference of the audio signal is reduced by the phase adjuster.

On the other hand, if it is determined from this detection signal that the audio signal is a music performance, such as singing, the adjustments shown below are carried out in the sound effect processor 121:

(1) The gain is increased by the gain adjuster;

(2) The delay time is extended by the delay time adjuster;

(3) The emphasis of the LF component is eliminated by the frequency characteristic adjuster; and (4) The phase difference of the audio signal is increased by the phase adjuster.

Thus, the sound effect signal with optimum sound is generated in each mode according to the respective characteristics of the audio signals. For instance, the voices, etc., can be clearly reproduced and cheers, songs, etc., can be joyfully listened to listeners.

Figure 26:
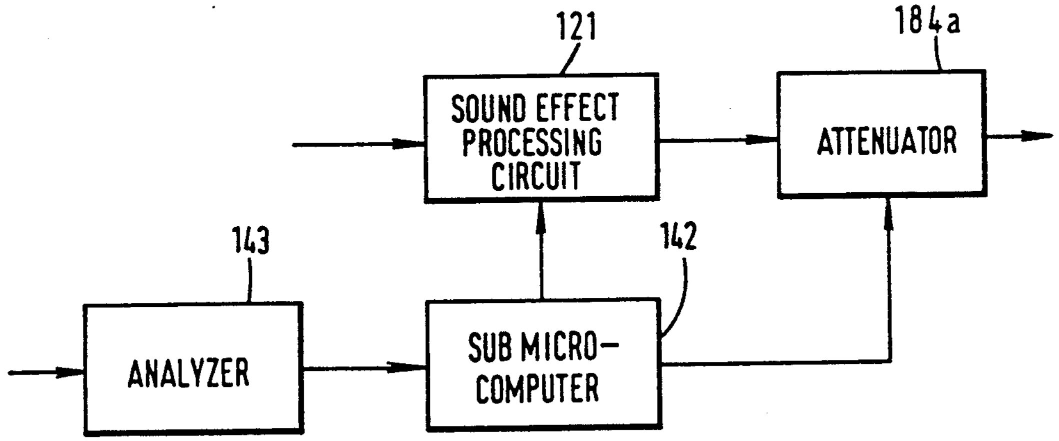
FIG. 26 is a block diagram showing another construction of the gain adjuster.
Figure 27:
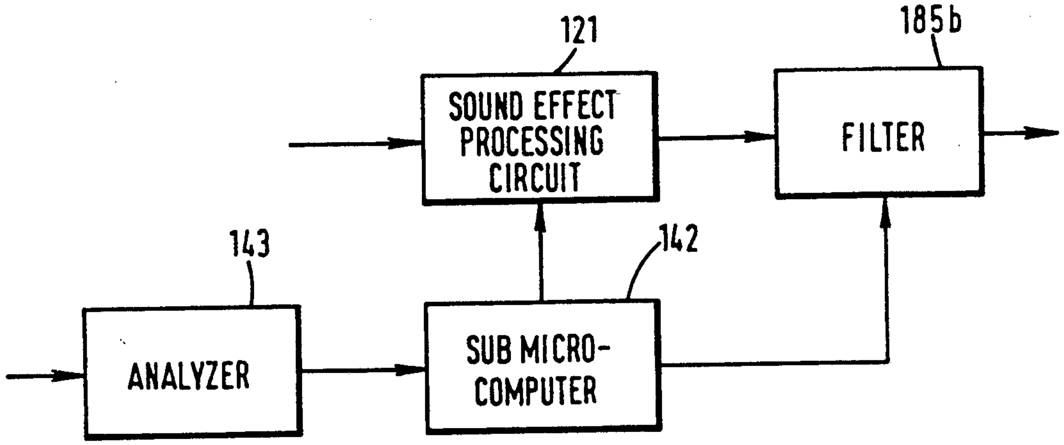
FIG. 27 is a block diagram showing another example of the frequency characteristic adjuster.

The gain adjuster, the delay time adjuster, the frequency characteristic adjuster and the phase adjuster can be provided independently from the sound effect processor 121. For instance, the gain adjuster may be an attenuator 184*a*, as shown in FIG. 26. Further, the frequency characteristic adjuster may be a filter 184*b*, as shown in FIG. 27.

Further, the sound effect in each mode, each of the various gains, the delay time, the frequency characteristic and the phase can be changed in three ways or more.

OPERATION OF GAIN ADJUSTER

Figure 28:
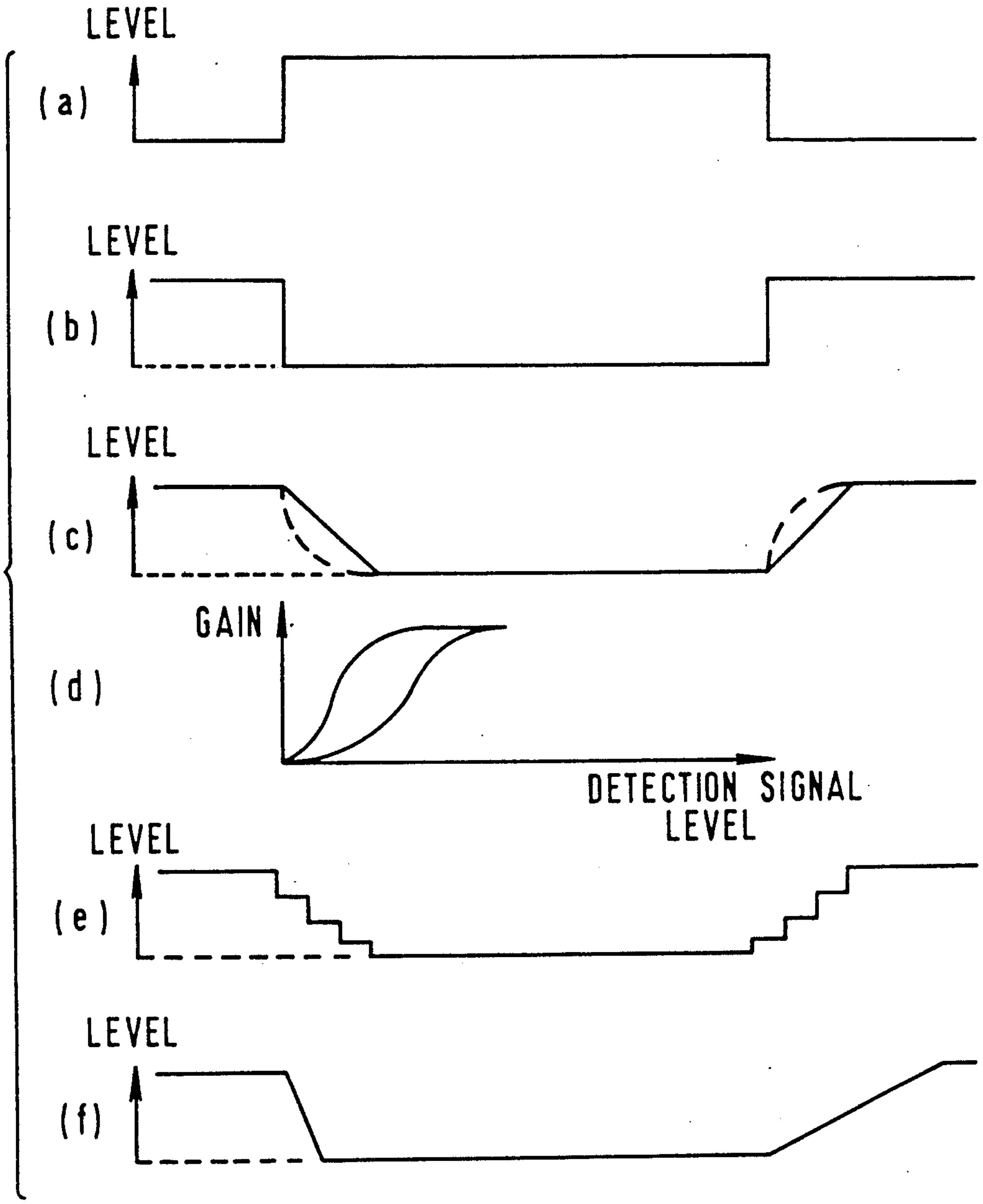
FIG. 28 is a time chart for explaining the operation of the gain adjuster.

FIG. 28 shows the timing charts for explaining the operation of the gain adjuster. In the gain adjuster, the gain adjusting signal is simply changed between two preset values (FIG. 28*b*) in response to the detection signal (FIG. 28*a*) from the analyzer 143. Thus, the reproduced sound effect is changed so that listeners may listen to the reproduced sound from the center front direction or from a surround sound mode.

There are various ways to perform the gain adjusting operation other than the above operation. For instance, the gain adjusting signal may be changed with a prescribed delay time (FIG. 28*c*). Thus, unnaturalness of the reproduced sound at the change is moderated. Another example may be to change the gain adjusting signal with a prescribed hysteresis (FIG. 28*d*). Thus, unnaturalness of the reproduced sound may also be moderated. Further the gain adjusting signal may be gradually changed (FIG. 28*e*). Thus, unnaturalness of the reproduced sound may be moderated. Still further, the gain adjusting signal may be rapidly changed in case of voices spoken by announcers, etc., or slowly changed in case of cheers or hand clapping (FIG. 28*f*). Thus, undesired reverberation may be quickly eliminated at the change to the voices of announcers, or reverberation may be gradually emphasized at the change to cheers or hand clapping.

OPERATION OF DELAY TIME ADJUSTER

Figure 29:
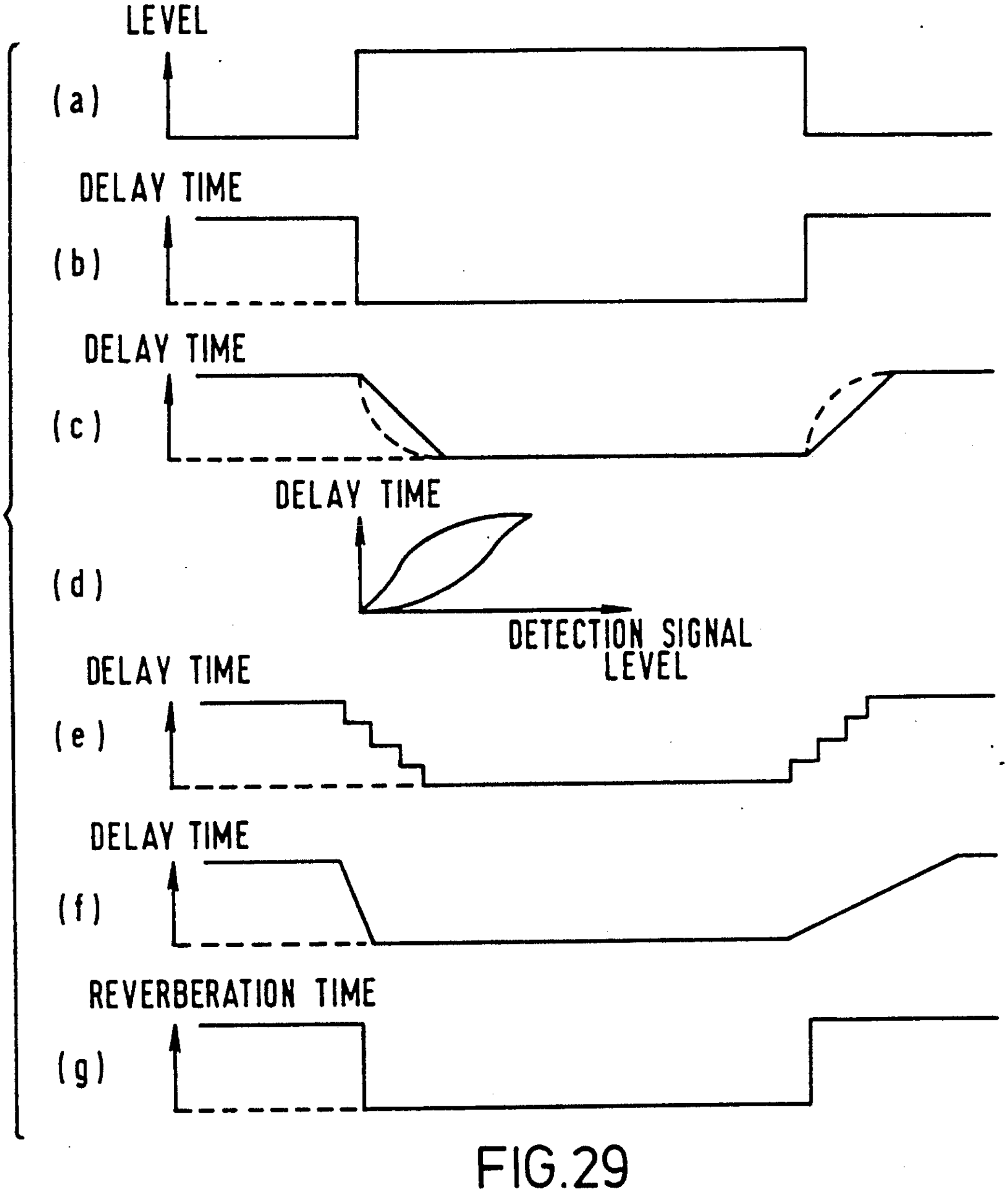
FIG. 29 is a time chart for explaining the operation of the delay time adjuster.

FIG. 29 shows timing charts for explaining the operation of the delay time adjuster.

As shown in FIG. 29, the delay time adjusting signal is simply changed between two preset values (FIG. 29*b*) in response to the detection signal (FIG. 29*a*) from the analyzer 143. Thus, the reproduced sound effect is changed so that listeners may listen to the reproduced sound from the center front direction or from a surround sound mode.

There are various ways to perform the delay time adjusting operation other than the above operation. For instance, the delay time adjusting signal may be changed with a prescribed delay time (FIG. 29*c*). Thus, unnaturalness of the reproduced sound at the change may be moderated. Another example is to change the delay time adjusting signal with a prescribed hysteresis (FIG. 29*d*). Thus, unnaturalness of the reproduced sound may also be moderated. Further the gain adjusting signal may be gradually changed (FIG. 29*e*). Thus, unnaturalness of the reproduced sound may be moderated. Still further, the delay time adjusting signal may be rapidly changed in case of voices spoken by announcers, etc., or slowly changed in case of cheers or hand clapping (FIG. 29*f*). Thus, undesired reverberation may be quickly eliminated at the change to the voices of announcers, or reverberation may be gradually emphasized at the change to cheers or hand clapping. The reverberation time can be changed (FIG. 29*g*) to produce the optimum sound effect according to the detection signal.

OPERATION OF FREQUENCY CHARACTERISTIC ADJUSTER

In the frequency characteristic adjuster, the LF component of the audio signal is increased or decreased according to the detection signal from the analyzer 143. Thus, the sound effect can be made conspicuous or inconspicuous for listeners.

There are various ways to perform the frequency characteristic adjusting operation other than the above operation. For instance, the gain of the HF component of the audio signal may be adjusted in response to the detection signal from the analyzer 143. Another example is to eliminate the HF component of the audio signal in response to the detection signal. Further the LF component of the audio signal may be eliminated in response to the detection signal. Still further the gain of the LF component of the center channel audio signal, which does not include reverberation, may be adjusted. Still further, the frequency characteristic of the audio signal may be adjusted in response to the detection signal. In any of the above cases, the sound effect can be made conspicuous or inconspicuous for listeners.

OPERATION OF PHASE ADJUSTER

In the phase adjuster, the phase of specific left and right audio signals, or phase of all signals may be changed to be in an opposite phase or an inphase relationship according to the detection signal from the analyzer 143. Thus, it is possible to make the stereophonic sound effect heavy or weak.

There are various ways to perform the phase adjusting operation other than the above operation. For instance, the phases of components of the audio signal may be partially inverted in response to the detection signal. Thus, it is possible to change the stereophonic sound effects between the components of the audio signal.

CONTROL OPERATIONS FOR ADJUSTING GAIN, DELAY TIME, FREQUENCY CHARACTERISTIC AND PHASE

This control operation is carried out by changing at least one parameter of the gain, the delay time, the frequency characteristic and the phase of the audio signal to preset values according to the detection signal from the analyzer 143. Thus, it is possible to produce an optimum sound effect.

There are various ways to perform the operations for changing the parameters other than the above operation. For instance, a prescribed parameter may be changed with the delay time. Thus, unnaturalness of the reproduced sound at the change may be moderated. Another example is to change a prescribed parameter with a hysteresis function. Thus, unnaturalness of the reproduced sound at the change may also be moderated. Further a prescribed parameter may be gradually changed in several steps. Still further a prescribed parameter may be rapidly changed in the case of voices spoken by announcers, etc., or slowly changed in the case of cheers or hand clapping. Thus, undesired reverberation is quickly eliminated at the beginning of the voices of announcers, or a reverberation is gradually emphasized at the beginning of cheers or hand clapping.

SYNCHRONIZING CIRCUIT IN SOUND EFFECT PROCESSOR 121

Figure 30:
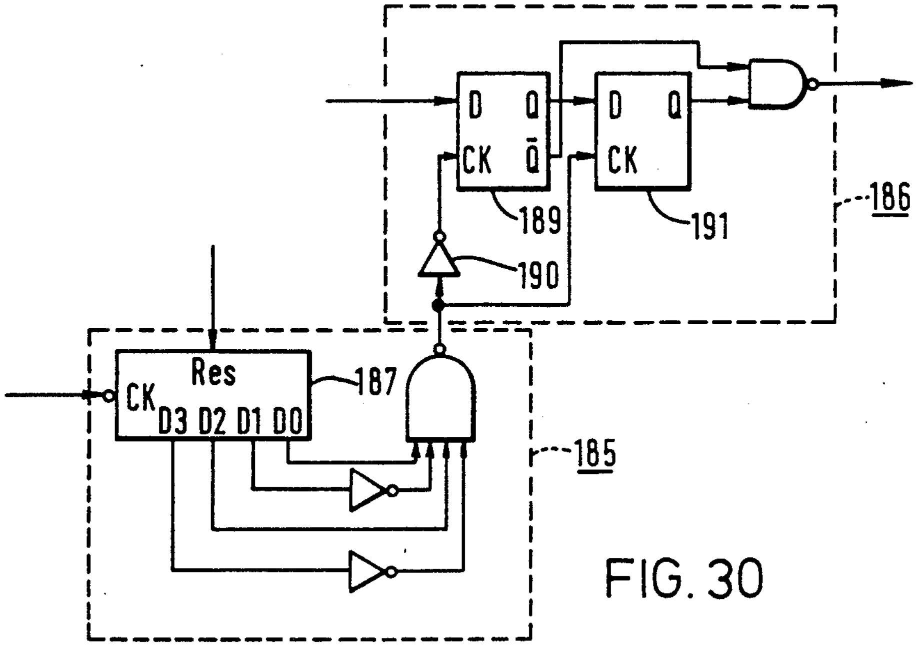
FIG. 30 is a schematic diagram showing details of the synchronizing circuit.

FIG. 30 is a diagram showing the construction of a synchronizing circuit included in the sound effect processor 121. The synchronizing circuit comprises a decoder 185 and an edge detector 186.

In the decoder 185, a start pulse from the sound field signal processor is input into the terminal Res of the binary counter 187 and a clock signal synchronized with the internal clock (corresponding to 1 step) of the sound field signal processor is input into the terminal CK. Count data from the binary counter 187 is input to a count value setting circuit 188, which is comprised of an NAND gate, an inverter, etc., when a preset count data value is detected. The preset count data value responds to the timing when data read/write are not performed out in a RAM 193, which is described later.

In the edge detector 186, the control signal from the sub microcomputer 142 is input into the terminal D of the first flip-flop 189 and the decode output signal from the decoder 185 is input into the terminal CK via the inverter 190. The data signal from the first flip-flop 189 is input into the terminal D of the second flip-flop 191 and a decode signal output from the decoder 185 is input into the terminal CK. An inverted data signal output from the first flip-flop 189 and a data signal output from the second flip-flop 191 are supplied as write pulses for use by the sound effect processor 121 through the NAND gate.

Figure 31:
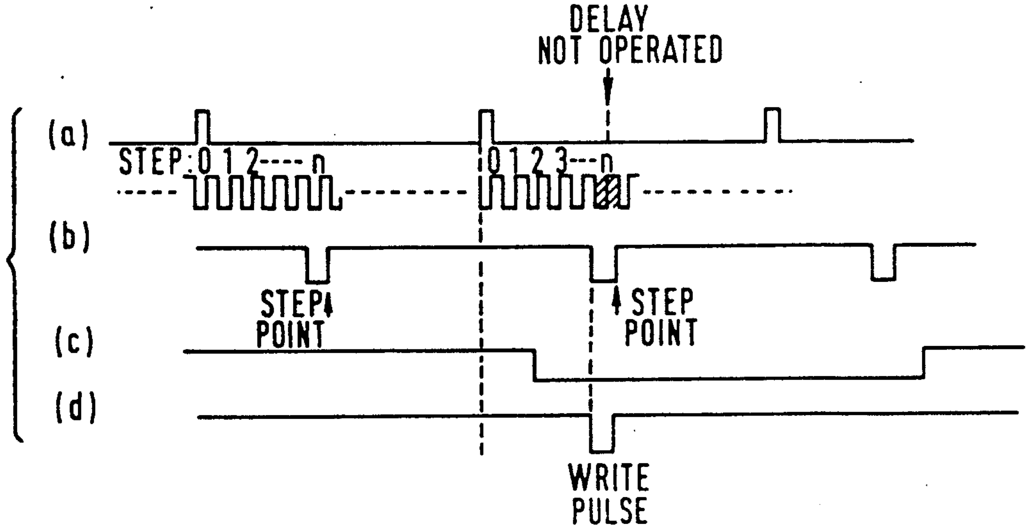
FIGS. 31 and 32 are time charts for explaining the operation of the synchronizing circuit.

FIG. 31 shows a timing chart for explaining the operation of this synchronizing circuit. A start pulse output from the sound effect processor 121 is synchronized with the clock "0" in synchronization with the internal clock of the sound effect processor 121.

When the start pulse is applied to the terminal Res of the binary counter 187 (FIG. 31*a*), the binary counter 187 is reset. Starting from here, the binary counter 187 counts the clock pulses (from "0") input into the terminal CK.

When the clock count has reached a set value, the decode signal is output from the count value setting circuit 188 (FIG. 31*b*). When the control signal output from the sub microcomputer 142 has been input into the edge detector 186 (FIG. 31*c*), a write pulse synchronized with the decode signal is output from the edge detector 186 (FIG. 31*d*) and supplied to the sound effect processor 121.

Figure 32:
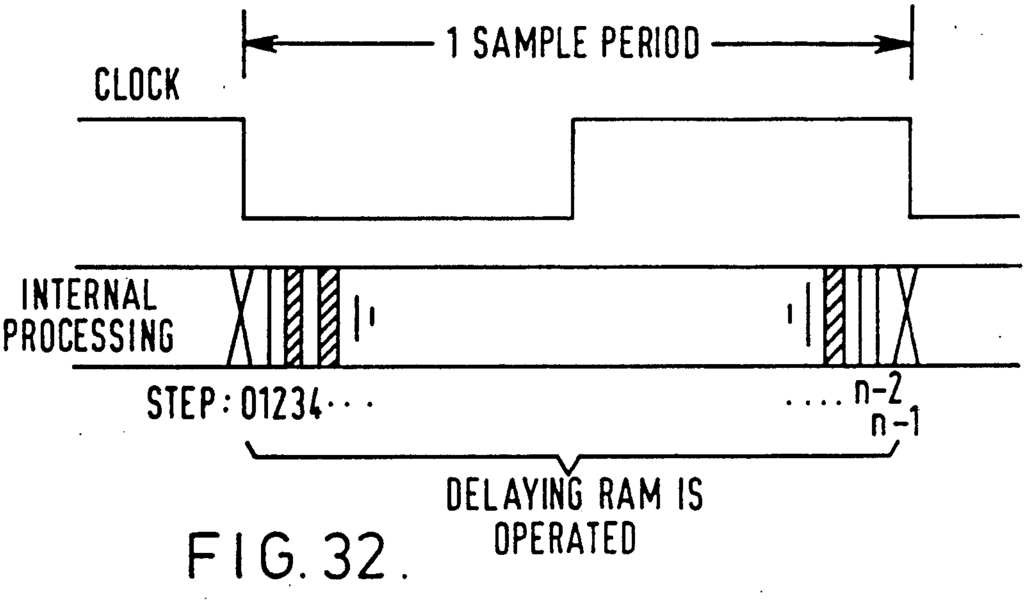

This synchronizing circuit has the functions in the manner following:

In the sound effect processor 121, when audio signals are applied with the prescribed process (generation of effect sound, etc.), the control signals (gain data signal, delay time data signal, etc.) from the sub microcomputer 142 are input into its processor. In this processor, processes in dozens stops per every sample of the audio signal are carried out based on the control signals, as shown in FIG. 32.

Figure 33:
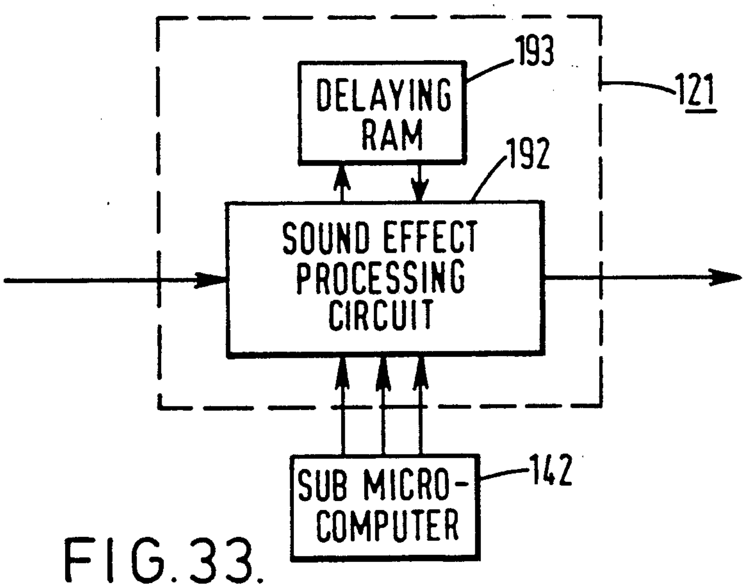
FIG. 33 is a block diagram showing another example of the synchronizing circuit.

Further, the sound effect processor 121 is provided with a sound effect processor 192, a RAM 193, etc., for holding one sample of data of the audio signal before and after the processing, in order to delay the audio signal, as shown in FIG. 33. Thus, the write/read operations of the data for the RAM 193 are carried out for every step.

Figure 34:
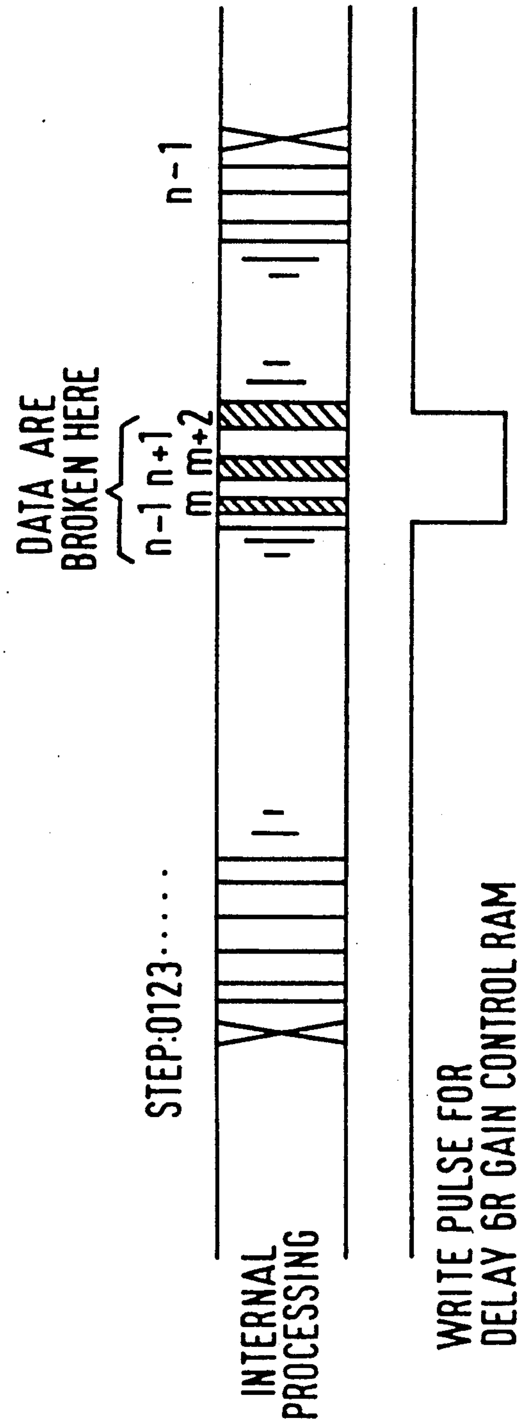
FIG. 34 is a time chart for explaining the operation of the synchronizing circuit of FIG. 33.

However, if the control signal from the sub microcomputer 142 is supplied to the sound effect processor 121 as an interruption (FIG. 34*b*) during the processing (FIG. 34*a*), as shown in FIG. 34, the data in the RAM 193 are disturbed during this process. The disturbed data causes noise.

The noise from the disturbed data can be prevented by sending the control signals from the sub microcomputer 142 into the sound effect processor 121 in synchronization with a write pulse which is output from the synchronizing circuit as mentioned above, that is, using the control signals when the data write/read are not carried out in the RAM 193.

Figure 35:
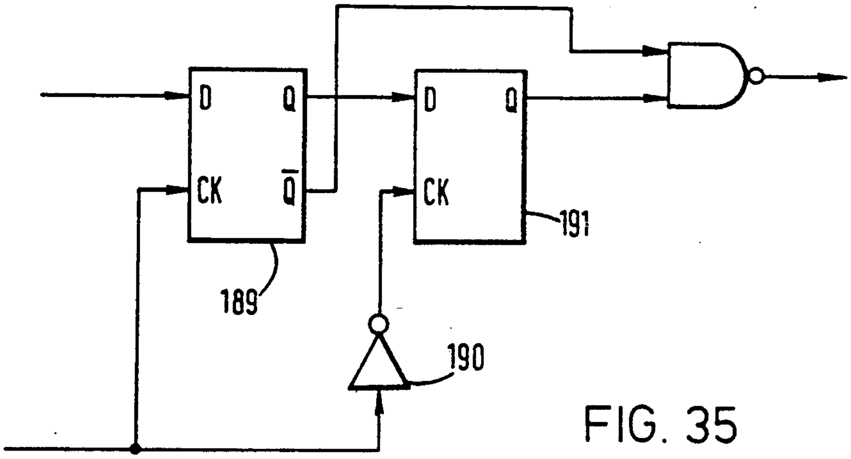
FIG. 35 is a schematic diagram showing still another example of the synchronizing circuit.
Figure 36:
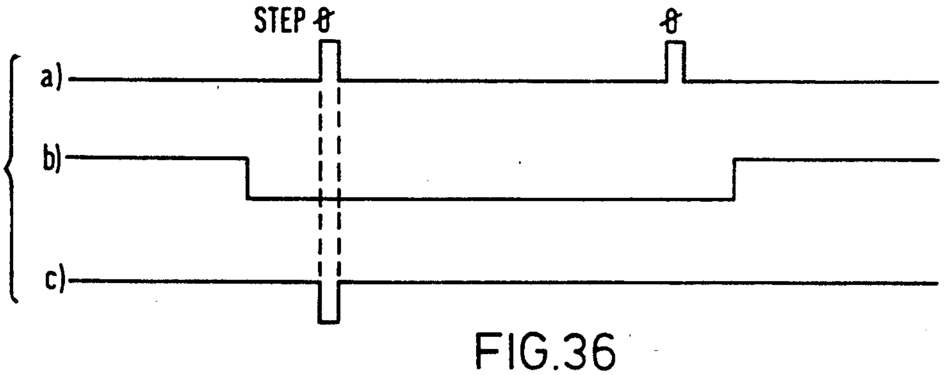
FIG. 36 is a time chart for explaining the operation of the synchronizing circuit of FIG. 35.

Further, when the setting step is "0" or synchronization is simply needed, this circuit can be made in the simplified construction by omitting the decoder, as shown in FIG. 35. The state of signals in this simplified construction is shown in FIG. 36.

OPERATION OF SUB MICROCOMPUTER 142

Figure 37:
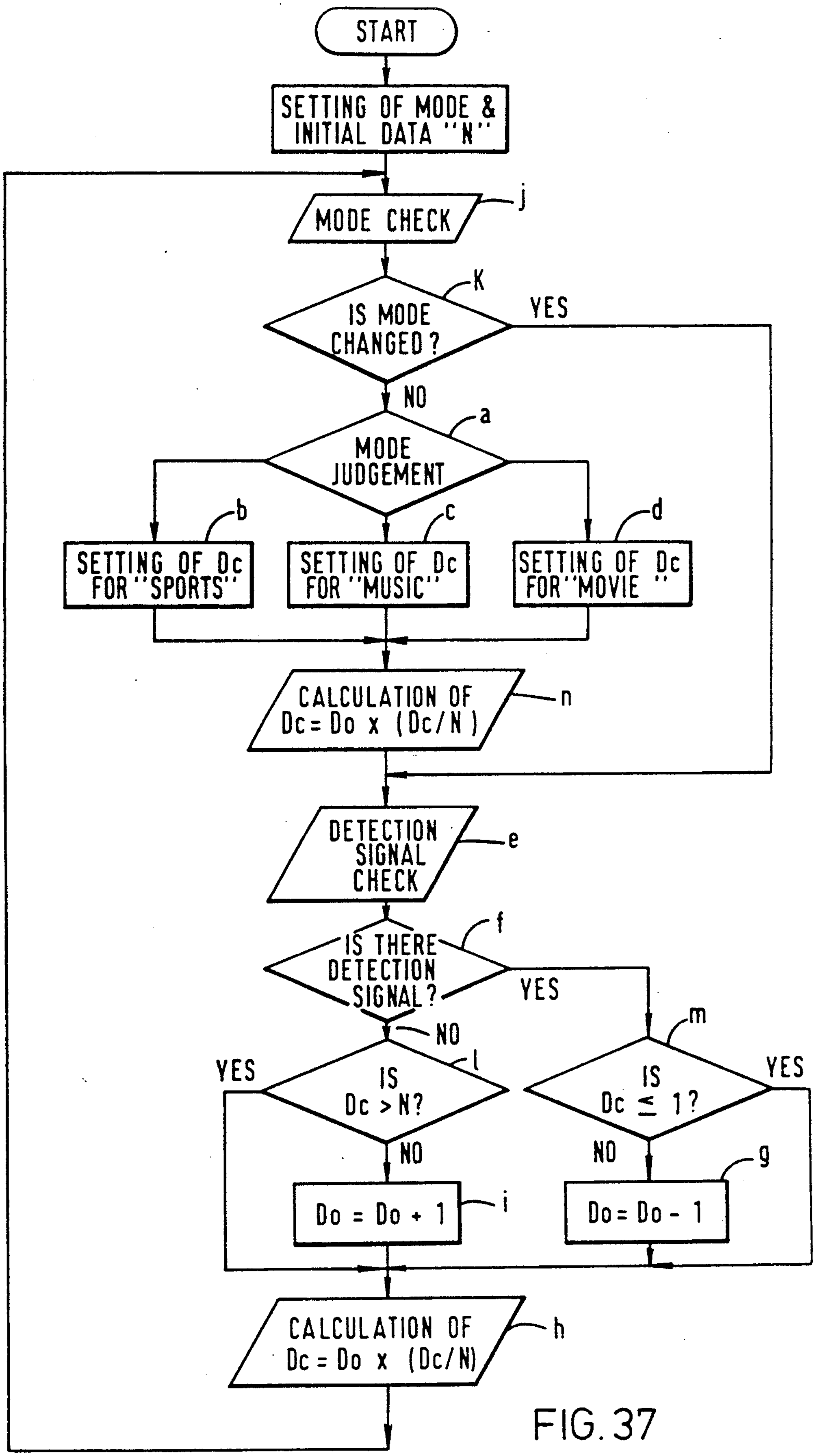
FIG. 37 is a flow chart showing the operation of the main microcomputer of FIG. 2.

The sound effect varies for each mode. An operation for gradually changing the sound will now be explained in reference to FIG. 37. FIG. 37 shows a flow chart showing the operation of the sub microcomputer 142.

First, a prescribed initial step data N of an operation step data Ds is set for executing the sound effect processing. Then, a prescribed mode is set (Steps a–d). A prescribed control data Dc is set for every mode. The sub microcomputer 142 checks a detection signal Sd output from the analyzer 143 (Step e). If the detection signal Sd is present (Step f), a unit "1" of an operation step data Ds is subtracted from a current operation step data Dn of the operation step data Ds; i.e., Do=Do−1 (Step g). This occurs in, e.g., the situation of voices spoken by announcers. Then, the following calculation is carried out with respect to a current control data Dc, a current step data Do of the operation step data Dn and the initial step data N (Step h):

$$Dc = Dc \times (Do/N) \qquad (I)$$

The calculation result is supplied to the sound effect processor 121 as the new control data Dc. The sound effect processor 121 generates the sound effect in response to the new control data Dc.

If the detection signal is not present (Step f), the unit "1" is added to the current step data Do for advancing the operation step data Dc; i.e., Do=Do+1 (Step i). This occurs in, e.g., the situation of cheers (Step i). Then, another calculation the same as the above calculation (I) is carried out (Step h). The calculation result is supplied to the sound effect processor 121 as the new control data Dc.

If the mode is the same as before, the same operations are repeated (Steps j and k). Further, when the current operation step data Dc exceeds the preset initial data "N" (Step l) or lowers below the unit data "1" (Step m), the operation is advanced without performing the above addition or the subtraction of the operation step data.

Further, if the mode has been changed (Steps j and k), the calculation result which was used in the mode previously executed is used as the initial control data of the new mode (Step n).

Figure 38:
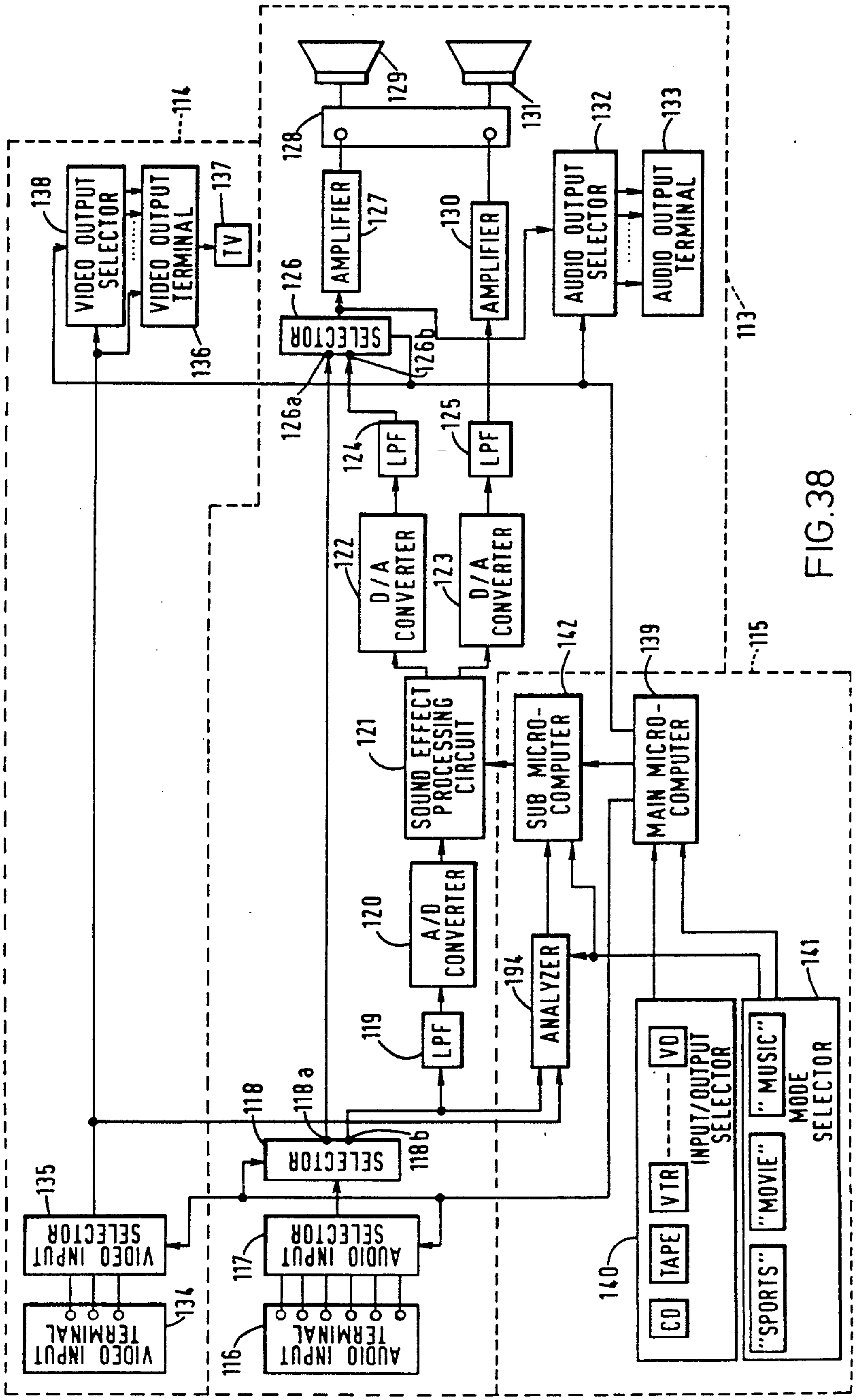
FIG. 38 is a block diagram showing a second embodiment of the audio signal processing apparatus according to the present invention.

FIG. 38 shows the construction of the audio signal processing apparatus according to the second embodiment of the present invention.

Figure 39:
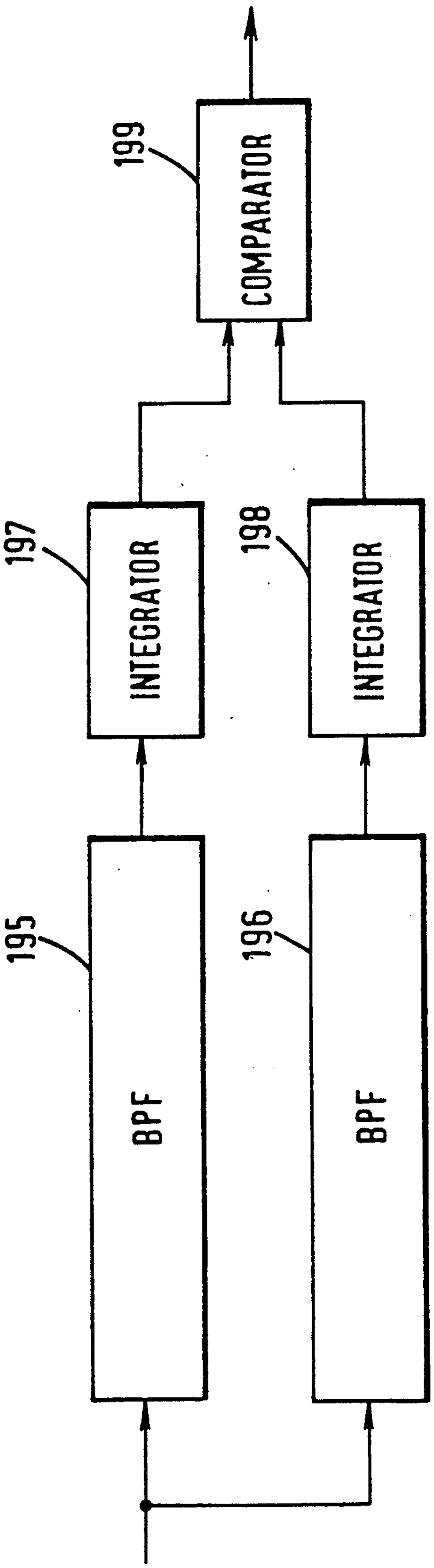
FIG. 39 is a block diagram showing details of the video analyzer of FIG. 38.

The audio signal processing apparatus shown in this diagram is provided with an analyzer 194 which analyzes not only audio signals but also video signals. FIG. 39 shows details of the video signal analyzer which has been incorporated in the analyzer 194.

A video signal is applied to the analyzer 194 from the video input terminal 134 (see FIG. 38). In FIG. 39, a luminance signal of the video signal is input into a first BPF 195 in the analyzer 194. The first BPF 195 passes therethrough the LF component of the luminance signal. The luminance signal is also input into a second BPF 196. The second BPF 196 passes therethrough the HF component of the luminance signal. The LF/HF components of the luminance signal video signal output from the first and second BPFS 195 and 196 are detected as level signals by integrators 197 and 198, respectively. The level signals are compared with each other by a comparator 199.

Generally, video signals of a zoomed up subject have a lower brightness and an even color distribution. On the other hand, video signals of subjects extending over a broad distance showing various things have a higher brightness and are uneven in color distribution. The video signal analyzer with this construction classifies the video signals by comparing the LF/HF components of the luminance signal..Thus, the audio signal processing apparatus shown in this embodiment changes the sound effect in response to the video signal analyzer.

The above embodiments of the present invention have been presented on the assumption which the audio system is a stereophonic sound system. However, in a monophonic sound system, the same effect in the above embodiment can be obtained.

As described above, according to the audio signal processing apparatus in the present invention, it is possible to produce optimum sound effect according to sound source situation at all times as the prescribed sound effect process is controlled to optimize it according to judged audio signal sound source situations.

As described above, the present invention can provide an extremely preferable sound effect system.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An audio signal processing apparatus for processing an input audio signal, comprising:

- an audio signal input means for receiving the input audio signal;
- an audio signal analysis means for analyzing the input audio signal and generating an output control signal;
- a sound effect processing means for performing prescribed sound effect processing on the input audio signal and outputting a resulting audio signal;
- a control means for controlling the sound effect processing means to optimize the sound effect processing in response to the control signal from the audio signal analysis means, said control means including mode selector means for allowing the selection of one of a plurality of modes by a user; and
- an audio signal output means for outputting the resulting audio signal.

2. An audio signal processing apparatus recited in claim 1, wherein the audio signal analysis means comprises:

- a low frequency extracting means for extracting low frequency signals from the input audio signal; and
- a signal level comparing means for comparing the level of the low frequency signals extracted by the low frequency extracting means with a preset level and for outputting the result of the comparison.

3. An audio signal processing apparatus recited in claim 1, wherein the audio signal analysis means comprises:

- a low frequency extracting means for extracting low frequency signals from the input audio signal;
- a first signal level fluctuation determining means for determining the level of fluctuation of the low frequency signals extracted by the low frequency extracting means and for outputting a first level determining signal;
- a high frequency component extracting means for extracting high frequency component signals from the input audio signal;
- a second signal level fluctuation determining means for determining the level of fluctuation of the high frequency component signals extracted by the high frequency component extracting means and for outputting a second level determining signal; and
- a signal level comparing means for comparing the first and second level determining signals and outputting the result of the comparison.

4. An audio signal processing apparatus recited in claim 1, wherein the audio signal analysis means comprises:

- an intermediate frequency component extracting means for extracting intermediate frequency component signals from the input audio signal;
- a first signal level fluctuation determining means for determining the level of fluctuation of the intermediate frequency component signals extracted by the intermediate frequency extracting means and outputting a first level fluctuation determining signal;
- a high frequency component extracting means for extracting high frequency component signals from the input audio signal;
- a second signal level fluctuation determining means for determining the level of fluctuation of the high frequency component signals extracted by the high frequency component extracting means and outputting a second level fluctuation determining signal; and
- a signal level comparing means for comparing the first and second level fluctuation determining signals from the first and second signal level fluctuation determining means and outputting the result of the comparison.

5. An audio signal processing apparatus recited in claim 1, wherein the audio signal analysis means comprises:

an intermediate frequency component extracting means for extracting intermediate frequency component signals from the input audio signal;

a first signal level fluctuation determining means for determining the level of fluctuation of the intermediate frequency component signals extracted by the intermediate frequency extracting means and outputting a first level fluctuation determining signal;

a low frequency component extracting means for extracting low frequency component signals from the input audio signal; and a second signal level fluctuation determining means for determining the level of fluctuation of the low frequency component signals extracted by the low frequency component extracting means and outputting a second level fluctuation determining signal; and a signal level comparing means for comparing the first and second level fluctuation determining signals from the first and second signal level fluctuation determining means and outputting the result of the comparison.

6. An audio signal processing apparatus recited in claim 1 wherein:

multiple channel audio signals are input independently into the audio signal processing means;

the audio signal analysis means includes a signal level difference determining means for determining the difference in signal level between the multiple channel audio signals, and a signal level comparing means for comparing the signal level difference with a predetermined level and outputting the result of the comparison; and the sound effect processing means performs the sound effect processing on the multiple channel audio signals in response to the output of the signal level comparing means.

7. An audio signal processing apparatus recited in claim 1 wherein the sound effect processing means adjusts the gain of the input audio signal.

8. An audio signal processing apparatus recited in claim 7 wherein the sound effect processing means gradually changes the gain of the input audio signal.

9. An audio signal processing apparatus recited in claim 1 wherein the sound effect processing means adjusts the delay time of the input audio signal.

10. An audio signal processing apparatus recited in claim 9 wherein the sound effect processing means gradually changes the delay time of the input audio signal.

11. An audio signal processing apparatus recited in claim 9 wherein the sound effect processing means adjusts the delay time of the input audio signal to provide either a long or a short reverberation time.

12. An audio signal processing apparatus recited in claim 1 wherein the sound effect processing means adjusts the frequency characteristic of the input audio signal.

13. An audio signal processing apparatus recited in claim 12 wherein the sound effect processing means adjusts the frequency characteristic of the input audio signal by dividing the audio signal into a low frequency signal component and high frequency signal component and adjusts the gain of either or both of the low and high frequency component signals.

14. An audio signal processing apparatus recited in claim 1 wherein the sound effect processing means adjusts the phase of the input audio signal.

15. An audio signal processing apparatus recited in claim 14 wherein the sound effect processing means adjusts the phase of the input audio signal on multiple channels.

16. An audio signal processing apparatus recited in claim 1 wherein the sound effect processing means adjusts one or more of the gain, delay time, frequency characteristic, and phase of the input audio signal.

17. An audio signal processing apparatus recited in claim 1, further comprising:

a signal level detecting means for detecting the level of the input audio signal; and a signal level control means for controlling the signal level of the input audio signal in response to the level detected by the signal level detecting means.

18. An audio signal processing apparatus recited in claim 1, wherein the audio signal analysis means comprises a delay means for delaying the output control signal.

19. An audio signal processing apparatus for processing an input audio signal, comprising:

an audio signal input means for receiving the input audio signal;

a video signal input means for receiving input video signals;

a video signal analysis means for analyzing the input video signals and generating an output control signal;

a sound effect processing means for performing a prescribed sound effect processing on the input audio signal and outputting a resulting audio signal;

a control means for controlling the sound effect processing means to optimize the sound effect processing in response to the control signal from the video signal analysis means, said control means including mode selector means for allowing the selection of one of a plurality of modes by a user; and an audio signal output means for outputting the resulting audio signal.

20. An audio signal processing apparatus recited in claim 19, wherein the video signal analysis means comprises:

a low frequency extracting means for extracting low frequency signals from the luminance signal contained in the input video signals;

a first signal level determining means for determining the level of the low frequency signals extracted by the low frequency extracting means and outputting a first level determining signal;

a high frequency component extracting means for extracting high frequency component signals from the luminance signal and outputting a second level determining signal;

a second signal level determining means for determining the level of the high frequency component signals extracted by the high frequency component extracting means and outputting a second level determining signal; and a signal level comparing means for comparing the first and second level determining signals and outputting the result of the comparison.

21. An audio signal processing apparatus for processing an input audio signal, comprising:

an audio signal input means for receiving the input audio signal;

an audio signal analysis means for analyzing the input audio signal and generating a first output control signal;

a video signal input means for receiving input video signals;

a video signal analysis means for analyzing the input video signals and generating a second output control signal;

a sound effect processing means for performing a prescribed sound effect processing on the input audio signal and outputting a resulting audio signal;

a control means for controlling the sound effect processing means to optimize the sound effect processing in response to the first and second control signals from the audio and video signal analysis means; and an audio signal output means for outputting the resulting audio signal.

22. An audio signal processing apparatus recited in claim 7, wherein the sound effect processing means reduces the gain applied to the input audio signal if the audio signal analysis means determines that the input audio signal source is vocal.

23. An audio signal processing apparatus recited in claim 9, wherein the sound effect processing means shortens the delay time of the input audio signal if the audio signal analysis means determines that the input audio signal source is vocal.

24. An audio signal processing apparatus recited in claim 9, wherein the sound effect processing means shortens the delay time of the input audio signal if a movie mode is selected.

25. An audio signal processing apparatus recited in claim 12, wherein the sound effect processing means emphasizes the low frequency component of the input audio signal if the audio signal analysis means determines that the input audio signal source is vocal.

26. An audio signal processing apparatus recited in claim 14, wherein the sound effect processing means adjusts the phase of the input audio signal if the audio signal analysis means determines that the input audio signal source is vocal.

* * * * *